United States Patent
Florian et al.

(10) Patent No.: US 11,528,545 B2
(45) Date of Patent: Dec. 13, 2022

(54) SINGLE-ENDED READOUT OF A DIFFERENTIAL MEMS DEVICE

(71) Applicant: Infineon Technologies AG, Neubiberg (DE)

(72) Inventors: Wilfried Florian, Villach (AT); Niccoló De Milleri, Villach (AT); Philipp Greiner, Graz (AT); Andreas Wiesbauer, Poertschach (AT); Martin Wurzer, Munich (DE); Bert Zinserling, Oberpframmern (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/243,229

(22) Filed: Apr. 28, 2021

(65) Prior Publication Data

US 2022/0353594 A1    Nov. 3, 2022

(51) Int. Cl.
| | | |
|---|---|---|
| H04R 1/08 | (2006.01) | |
| H04R 3/00 | (2006.01) | |
| H03F 3/181 | (2006.01) | |
| H03F 3/183 | (2006.01) | |

(52) U.S. Cl.
CPC .............. *H04R 1/08* (2013.01); *H03F 3/183* (2013.01); *H03F 2200/03* (2013.01); *H04R 3/00* (2013.01); *H04R 2201/003* (2013.01)

(58) Field of Classification Search
CPC . H04R 1/08; H04R 3/00; H04R 19/04; H04R 19/005; H04R 2410/03; H04R 2201/003; H03F 3/181; H03F 3/183; H03F 3/45; H03F 3/45071; H03F 1/34; H03F 2200/03; B81B 7/02; B81B 7/008; B81C 1/00; B81C 1/00158; B81C 1/0023
See application file for complete search history.

(56) References Cited

U.S. PATENT DOCUMENTS

| | | | |
|---|---|---|---|
| 10,764,680 B2 | 9/2020 | Park | |
| 10,972,122 B2* | 4/2021 | Steiner | ...................... H03F 3/70 |
| 2013/0051582 A1* | 2/2013 | Kropfitsch | ................ H03F 1/56 |
| | | | 330/144 |
| 2013/0129116 A1* | 5/2013 | Kropfitsch | .............. H04R 19/04 |
| | | | 327/33 |
| 2014/0064523 A1* | 3/2014 | Kropfitsch | .............. H03F 3/181 |
| | | | 381/174 |
| 2014/0376749 A1 | 12/2014 | Nielsen | |
| 2015/0023529 A1* | 1/2015 | Barzen | ................... H04R 31/00 |
| | | | 381/174 |
| 2015/0131813 A1 | 5/2015 | Kim et al. | |
| 2022/0194784 A1* | 6/2022 | Fueldner | ............... B81B 7/0041 |

* cited by examiner

*Primary Examiner* — Thang V Tran
(74) *Attorney, Agent, or Firm* — Slater Matsil, LLP

(57) ABSTRACT

A circuit includes a first biasing voltage source, a second biasing voltage source, a first resistor device coupled between the first biasing voltage source and a first terminal of the circuit, a second resistor device coupled between the second biasing voltage source and a second terminal of the circuit, a third resistor device coupled between the second biasing voltage source and a third terminal, a first capacitor coupled between the third terminal and ground, and an amplifier having an input coupled to the second terminal and an output coupled to a circuit output.

18 Claims, 21 Drawing Sheets

SINGLE-ENDED READOUT OF A DIFFERENTIAL MEMS DEVICE

TECHNICAL FIELD

The present invention relates generally to a single-ended readout of a differential microelectromechanical system (MEMS) and an associated method.

BACKGROUND

A MEMS microphone typically includes a MEMS device, readout circuitry coupled to the MEMS device, an analog-to-digital converter (ADC) coupled to the readout circuitry, and digital signal processing components coupled to the ADC. The MEMS device converts environmental sound pressure into analog signals. To achieve high system linearity a differential MEMS device having a double-backplate (DBP) and a moveable membrane therebetween is typically used. The MEMS device is typically packaged in a package having a port so that the moveable membrane is in communication with the environmental sound pressure. The readout circuitry can include biasing resistors and amplification circuits. The digital signal processing components can include coder-decoder (codec) circuits, as well as other such digital signal processing circuits. In some applications the codec used in the digital signal processing has a single-ended input. Thus, single-ended readout circuitry with good linearity is desired to provide a single-ended signal to the codec. A power-efficient DBP MEMS microphone with a single-ended interface is desired.

MEMS microphones typically exhibit typical frequency response that is flat in the audio band and has an increased sensitivity (a resonance peak) in the ultrasonic (US) frequency range. This increased sensitivity is caused by mechanical properties of the MEMS and the package, and causes a larger read out signal level in this frequency range. A boost of 10 dB to 30 dB is possible, depending on the damping of the MEMS and package sound channel. For high signal-to-noise ratio (SNR) MICs the damping is typically low and thus the boosting is more pronounced. In general, the resonance peak could also be at a non-US frequency (e.g. in the audible frequency range). Low level ultrasonic signals generally do not cause problems, but increasing US signal levels can cause audible artefacts. The audible artefacts can comprise intermodulation distortion components that generate audio frequency components. In some use cases (when strong US signals are present, e.g. from motion detectors) the ultrasonic signal can even block the subsequent signal processing chain (because the increased signal level drives an application-specific integrated circuit (ASIC) pre-amplifier of the MEMS microphone into clipping).

SUMMARY

According to an embodiment, a circuit includes a first biasing voltage source; a second biasing voltage source; a first resistor device coupled between the first biasing voltage source and a first terminal of the circuit; a second resistor device coupled between the second biasing voltage source and a second terminal of the circuit; a third resistor device coupled between the second biasing voltage source and a third terminal; a first capacitor coupled between the third terminal and ground; and an amplifier having an input coupled to the second terminal, and an output coupled to a circuit output.

According to an embodiment, a method of biasing a microelectromechanical (MEMS) device having a first terminal, a second terminal, and a third terminal includes applying a first biasing voltage to the first terminal through a first impedance; applying a second biasing voltage to the second terminal through a second impedance; applying the second biasing voltage to the third terminal through a third impedance; and buffering a voltage at the second terminal to provide an output voltage signal.

According to an embodiment, a circuit includes a microelectromechanical (MEMS) device having a first terminal and a second terminal; a first resistor device coupled between a first biasing voltage source and the first terminal; a second resistor device coupled between a second biasing voltage source and the second terminal; an amplifier having an amplifier input coupled to the second terminal, and an amplifier output; a filter having a filter input coupled to the amplifier output, and a filter output.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

MEMS microphone embodiments are described below comprising a differential-to-single-ended readout circuit with improved linearity and having calibration features. Other MEMS microphone embodiments are described below comprising a differential-to-single-ended readout circuit having an ultrasonic signal filter that is effective at the MEMS-ASIC interface.

Figure 1:
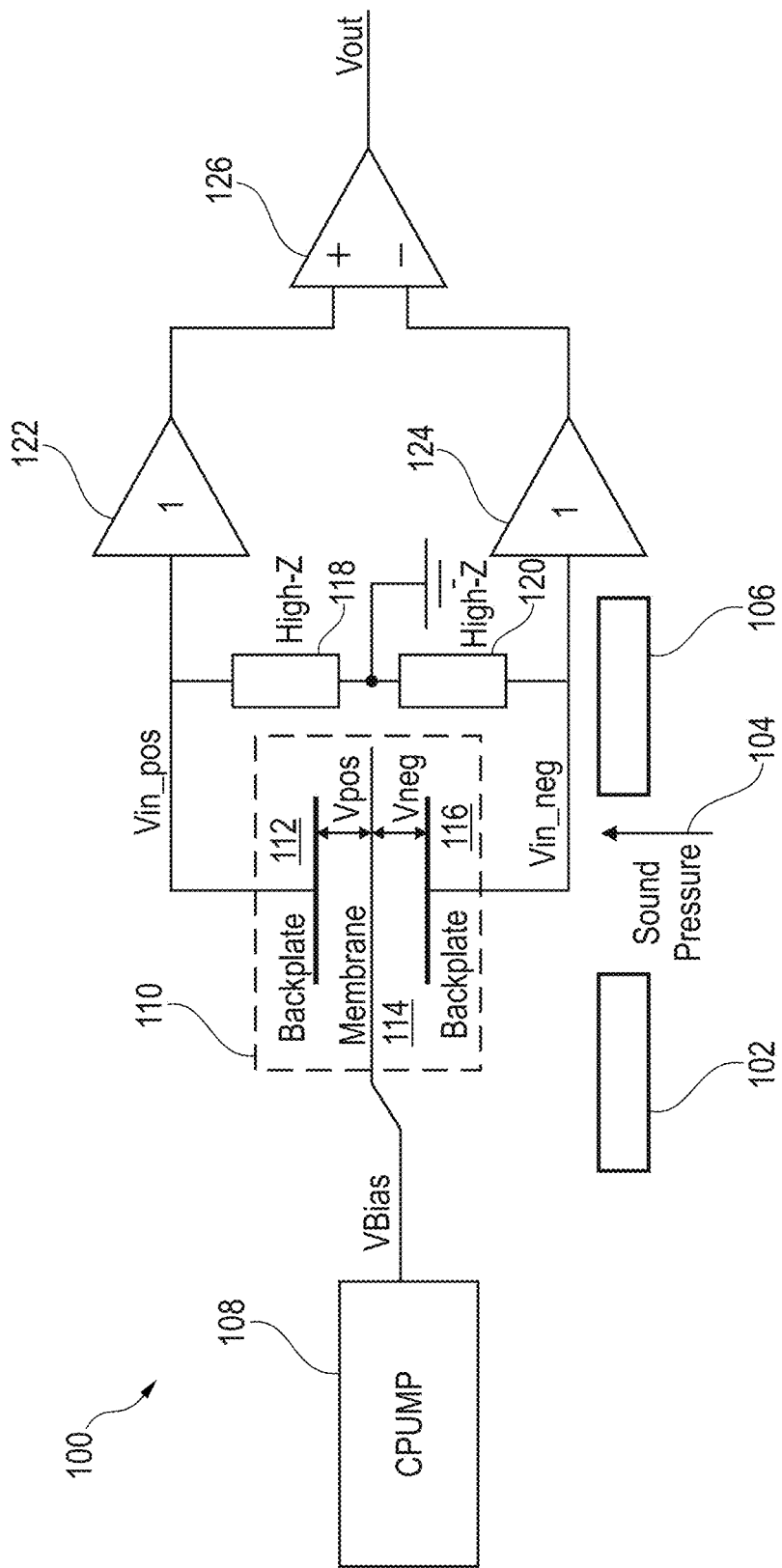
FIG. 1 is a schematic diagram of an exemplary MEMS microphone, including a first single-ended readout of a differential MEMS device.

FIG. 1 is a schematic diagram of an exemplary MEMS microphone 100, including a first single-ended readout of a differential MEMS device. MEMS microphone 100 comprises a charge pump 108 for generating a bias voltage VBias. MEMS microphone 100 also comprises a MEMS device no having a DBP configuration including a first backplate 112, a moveable membrane 114 spaced apart from the first backplate 112, and a second backplate 116 spaced apart the moveable membrane 114. Moveable membrane 114 receives the VBias voltage from charge pump 108. MEMS device no can be packaged in a package having a housing, in which housing portions 102 and 106 are spaced apart by a gap to allow entrance of the environmental sound pressure 104. In response to the environmental sound pressure 104, moveable membrane 114 generates a differential voltage comprising a first voltage component Vpos (referenced between moveable membrane 114 and first backplate 112) and a second voltage component Vneg (referenced between moveable membrane and second backplate 116). A first high impedance resistor 118 is coupled between the first backplate 112 (Vin_pos) and ground. A second high impedance resistor 120 is coupled between the second backplate 116 (Vin_neg) and ground. A first unity gain buffer amplifier 122 receives the Vin_pos voltage, and a second unity gain buffer amplifier 124 receives the Vin_neg voltage. An operational amplifier 126 has a positive input coupled to the output of first unity gain buffer amplifier 122, and a negative input coupled to the output of second unity gain buffer amplifier 124. Operational amplifier 126 provides a single-ended output voltage Vout representative of the differential voltage generated by MEMS device 110.

MEMS microphone 100 shown in FIG. 1 provides a full conversion of the differential voltage generated by MEMS device 110 into a single-ended output voltage Vout with good linearity. Equation [1] for the output voltage Vout is set forth below.

$$Vout = Vpos - Vneg \qquad [1]$$

In MEMS microphone 100, moveable membrane 114 sees symmetrical electro-static mechanical properties, and any possible electrical asymmetry in the Vpos voltage and in the Vneg voltage is compensated for both polarity excursions. While MEMS microphone provides differential-to-single-ended conversion, the approach as is shown in FIG. 1 may not be power efficient enough for certain power sensitive applications.

Figure 2:
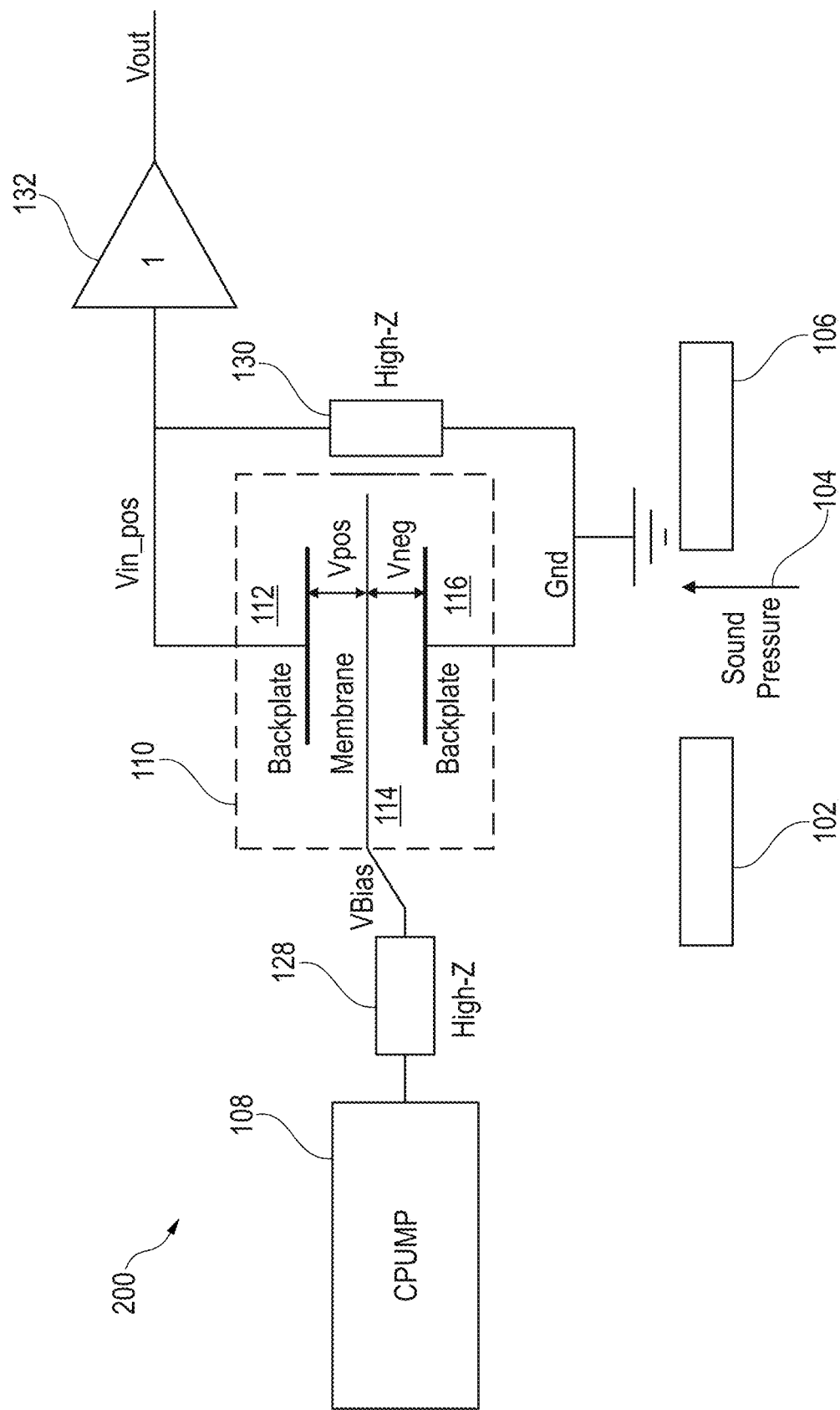
FIG. 2 is a schematic diagram of an exemplary MEMS microphone, including a second single-ended readout of a differential MEMS device.

FIG. 2 is a schematic diagram of an exemplary MEMS microphone 200, including a second single-ended readout of a differential MEMS device. MEMS microphone 200 also comprises a charge pump 108 as previously described. MEMS microphone 100 also comprises a MEMS device no having a DBP configuration including a first backplate 112, a moveable membrane 114, and a second backplate 116 as previously described. Note that the second backplate 116 is coupled to ground in the exemplary MEMS microphone 200 of FIG. 2. Moveable membrane 114 receives the VBias voltage, and a first high impedance resistor 128 is coupled between charge pump 108 and moveable membrane 114. MEMS device no can be packaged in a package having a housing including housing portions 102 and 106 spaced apart by a gap to allow entrance of the environmental sound pressure 104 as previously described. Moveable membrane 114 generates a differential voltage comprising a first voltage component Vpos and a second voltage component Vneg as previously described. A second high impedance resistor 130 is coupled between the first backplate 112 (Vin_pos) and ground. A single unity gain buffer amplifier 132 receives the Vin_pos voltage and provides a single-ended output voltage Vout representative of the differential voltage generated by MEMS device 110.

MEMS microphone 200 shown in FIG. 2 also provides a full conversion of the differential voltage generated by MEMS device 110 into a single-ended output voltage Vout with good linearity. Equation [1] also defines the output voltage Vout. In FIG. 2 moveable membrane 114 is semi-isolated, provides additional signal excursions, and has symmetrical electro-static mechanical properties. Possible electrical asymmetry in the Vpos and Vneg voltages is compensated for in both polarity signal excursions.

Due to the high impedance (due to first high impedance resistor 128) connection of charge pump 108, the charge is preserved at the node of the moveable membrane 114, and therefore the signal seen at the output node of single unity gain buffer amplifier 132, Vout, is the sum of the lower and upper MEMS capacitor signals. The non-linearities introduced by each side of MEMS device 110 act with opposite polarity obtaining overall a cancellation of the corresponding distortion.

In the approach of FIG. 2, the second backplate 116 is coupled to ground, which is a low ohmic reference. This imposes some constraints in the design of the single unity gain buffer amplifier 132. For improved symmetry (and linearity) the amplifier input (provided by first backplate 112) and the second backplate 116 should ideally have the same DC biasing, which in FIG. 2, is ground. The input of a buffer amplifier is typically biased at a voltage different from ground in order to optimize the available signal swing (hence the linearity) of the amplifier. Biasing voltages between 0.1V to 1.3V are typically used, depending on the circuit topology of the buffer amplifier and the available supply voltage.

Figure 3:
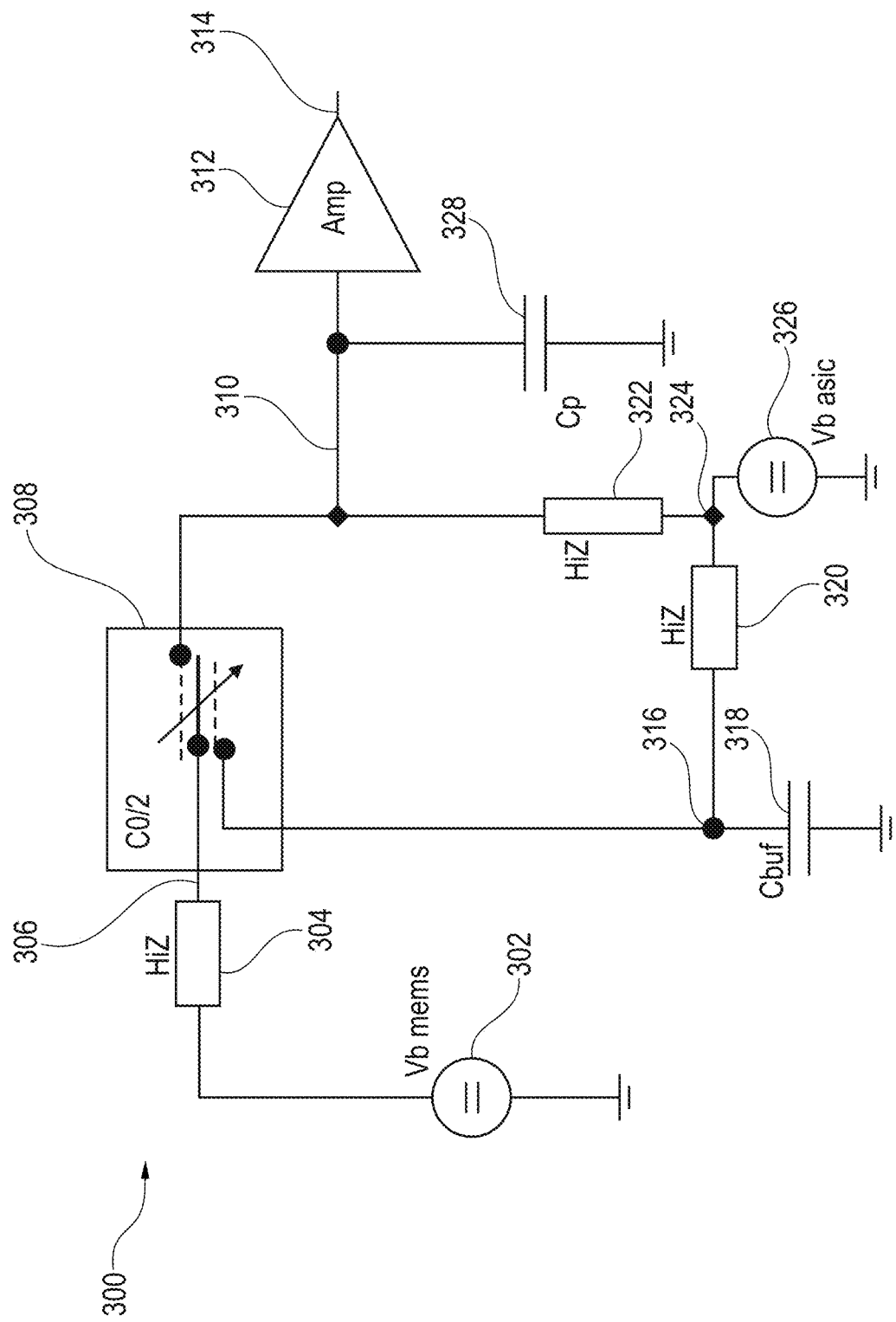
FIG. 3 is a schematic diagram of a DBP MEMS microphone according to an embodiment.

According to embodiments, a non-zero voltage at both the lower backplate and the upper backplate of the MEMS device is used to optimize the usable voltage swing of a buffer amplifier of the MEMS microphone. FIG. 3 shows a schematic diagram of an example MEMS microphone 300 illustrating how this functionality can be achieved. The configuration of FIG. 3 overcomes the biasing limitations of the configuration of FIG. 2. A MEMS microphone 300 comprising differential-to single-ended readout circuitry optimized for linearity and including calibration features is described in further detail below. MEMS microphone 300 provides a biasing voltage to the membrane and another biasing voltage to both backplates of the MEMS device.

FIG. 3 is a schematic diagram of a DBP MEMS microphone 300 according to an embodiment. MEMS microphone 300 includes a double backplate MEMS device 308 having a membrane coupled to circuit node or terminal 306, a first backplate coupled to circuit node or terminal 310 and a second backplate coupled to circuit node or terminal 316. The total device capacitance of MEMS device 308 is equal to Co/2, wherein the series connection of the two MEMS capacitances (each one having a value of Co) gives an equivalent total device capacitance of Co/2. MEMS microphone 300 includes a biasing voltage source 302 (Vb mems) and a biasing voltage source 326 (Vbasic). In an embodiment, the voltage value of biasing voltage source 302 and the voltage value of biasing voltage source 326 are unequal. MEMS microphone 300 includes a first resistor device 304 coupled between the biasing voltage source 302 and node 306, a second resistor device 322 coupled between biasing voltage source 326 and node 310, and a third resistor device 320 coupled between biasing voltage source 326 and node 316. A first capacitor 318 (Cbuf) is coupled between node 316 and ground. First capacitor 318 is a filter capacitor (and in combination with third resistor device 320 forms a low pass filter) to reduce a possible noise contribution of biasing voltage source 326 and other biasing voltage sources described in further detail below. First capacitor 312 is also a buffer capacitor that can be used in combination with a feedback capacitor for an output sensitivity adjustment as is described in further detail below. A unity gain buffer amplifier 312 has an input coupled to node 310, and an output coupled to output node 314, which is the circuit output of MEMS microphone 300. Capacitor Cp represents the parasitic capacitance at node 310, but additional capacitance Cp can be implemented to reduce the sensitivity of MEMS microphone 300 if desired. Node 310 is an interface to an ASIC including all of the components shown in FIG. 3 except for MEMS device 308 and capacitor 344 (best seen in FIG. 7), in an embodiment. MEMS microphone 300 and the ASIC have an interface at nodes 306, node 310, and 316. The packaging of MEMS microphone 300 is discussed in further detail below, especially with respect to FIG. 17. In an embodiment, the first resistor device 304, the second resistor device 322, and the third resistor device 320 having high resistance values in the gigohm range and are thus also labeled "HiZ" (high impedance) herein. The value of first resistor device 304, the second resistor device 322, and the third resistor device 320 can have equal resistance values in embodiments, or can have different resistance values in embodiments. Resistor device embodiments are described in further detail below, especially with respect to FIG. 18.

Figure 4:
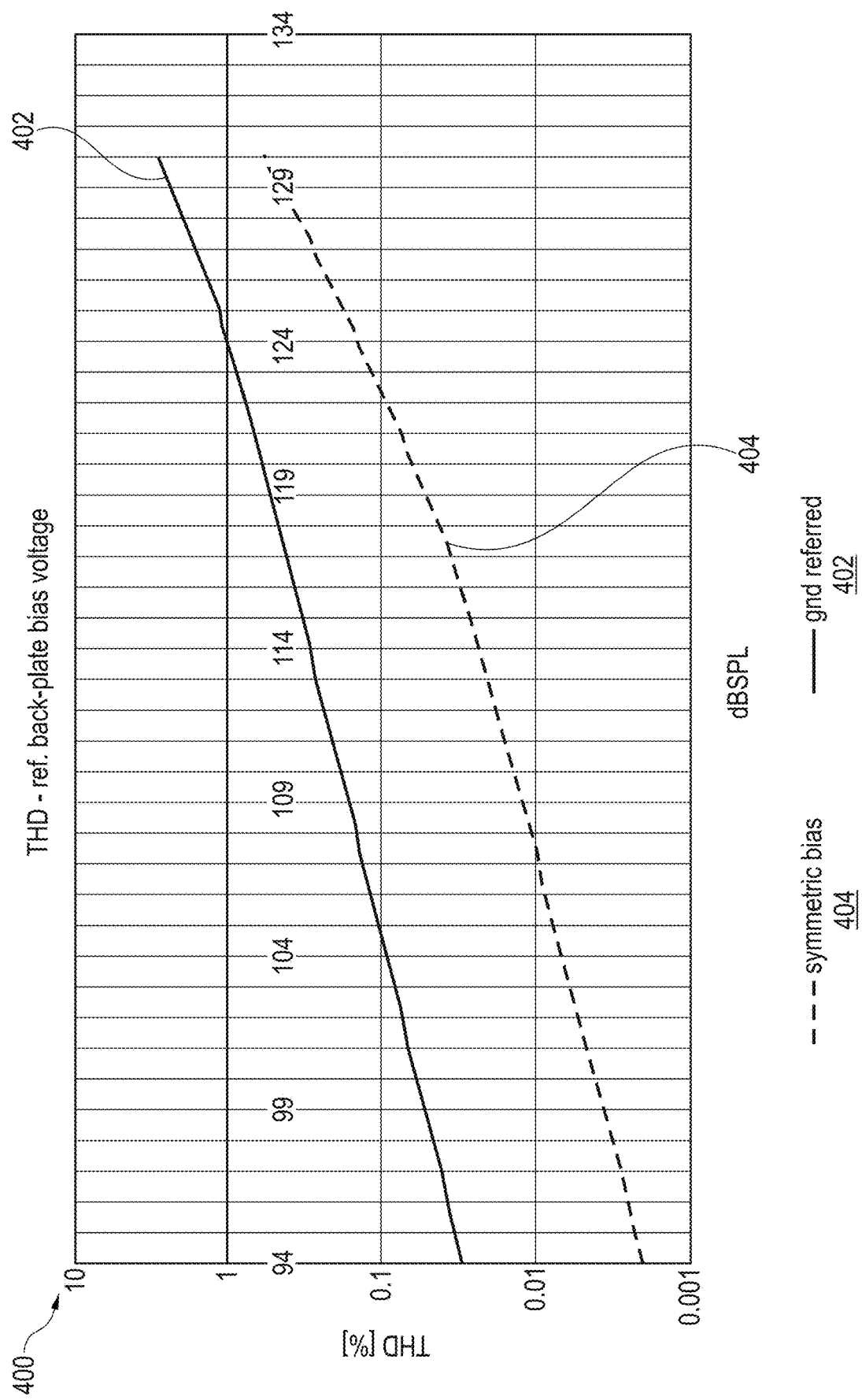
FIG. 4 is a graph comparing the total harmonic distortion of the MEMS microphone of FIG. 2 to the total harmonic distortion of the MEMS microphone of FIG. 3, with respect to sound pressure level.

FIG. 4 is a graph 400 comparing the total harmonic distortion (THD) 402 of the MEMS microphone 200 of FIG. 2 to the total harmonic distortion (THD) 404 of the MEMS microphone 300 of FIG. 3, with respect to sound pressure level (dBSPL). Due to the equal-valued biasing voltages of MEMS microphone 300, the THD is reduced with respect to MEMS microphone 200. For example, and a sound pressure level of 104 dBSPL, MEMS microphone 200 has a THD of about 0.1%, wherein as MEMS microphone has a THD of less than 0.01%. Similar THD improvements are shown at other sound pressure levels.

In an embodiment, a sensitivity adjustment option can be introduced. The sensitivity option is implemented by applying positive feedback to the circuit topology shown in FIG. 3. A schematic example of the sensitivity option configuration is shown in the MEMS microphone 500 of FIG. 5, according to an embodiment. MEMS microphone 500 includes biasing voltage source 302, biasing voltage source 326, first resistor device 304, second resistor device 322, third resistor device 320, first capacitor 318, MEMS device 308, and unity gain buffer amplifier 312 in the same configuration as shown in FIG. 3, all previously described. In addition, a second capacitor 330 (Cfb) is coupled between output node 314 and node 316 to provides positive feedback to the lower backplate of MEMS device 308. The feedback factor is determined mainly by the ratio of first capacitor 318 (Cbuf) and second capacitor 330 (Cfb). Adjusting the ratio (by adjusting the value of first capacitor 318 or second capacitor 330, or both) defines the sensitivity of MEMS microphone 500.

Figure 5:
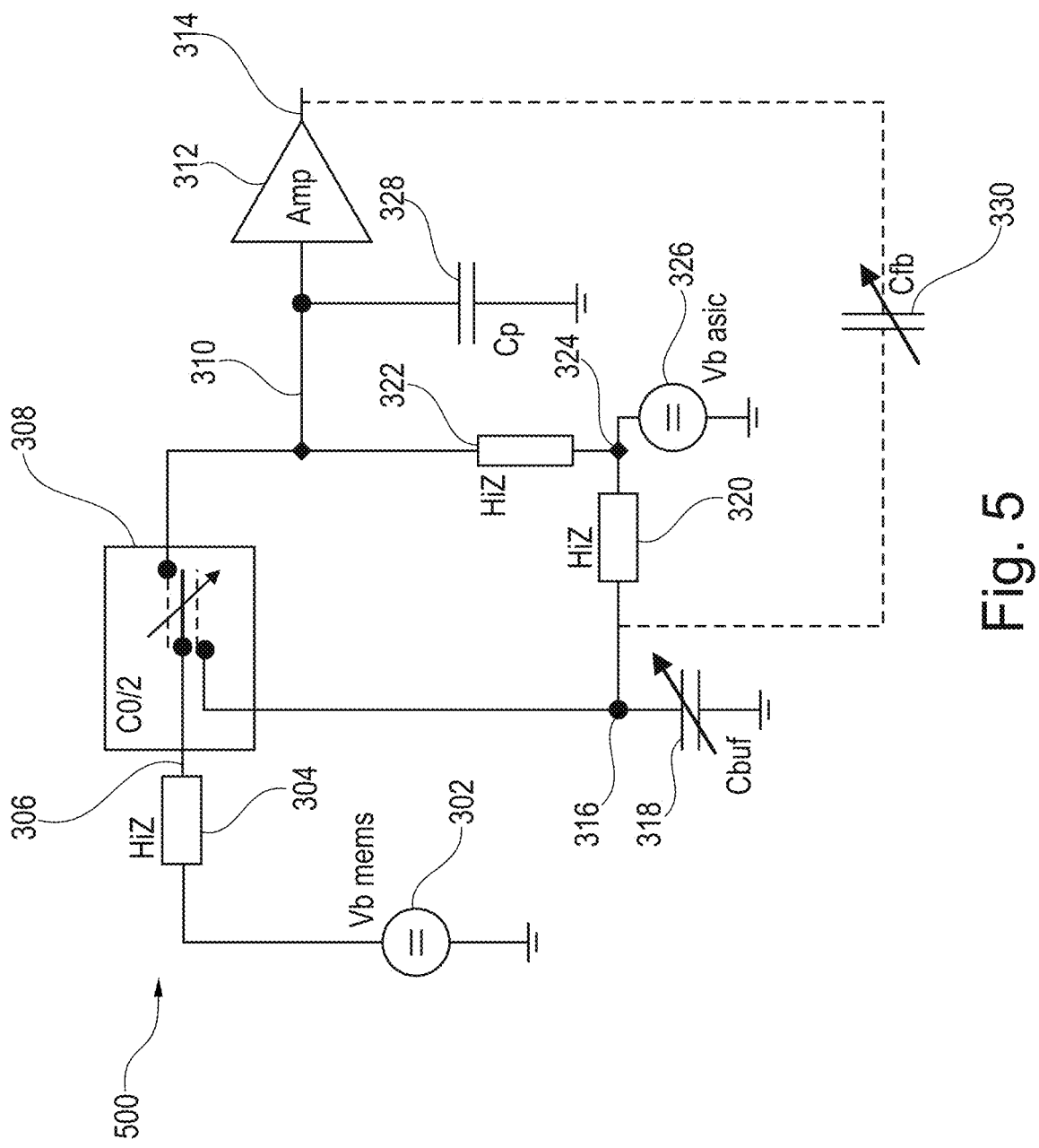
FIG. 5 is a schematic diagram of the MEMS microphone of FIG. 3 including sensitivity adjustment feedback, according to an embodiment.
Figure 6:
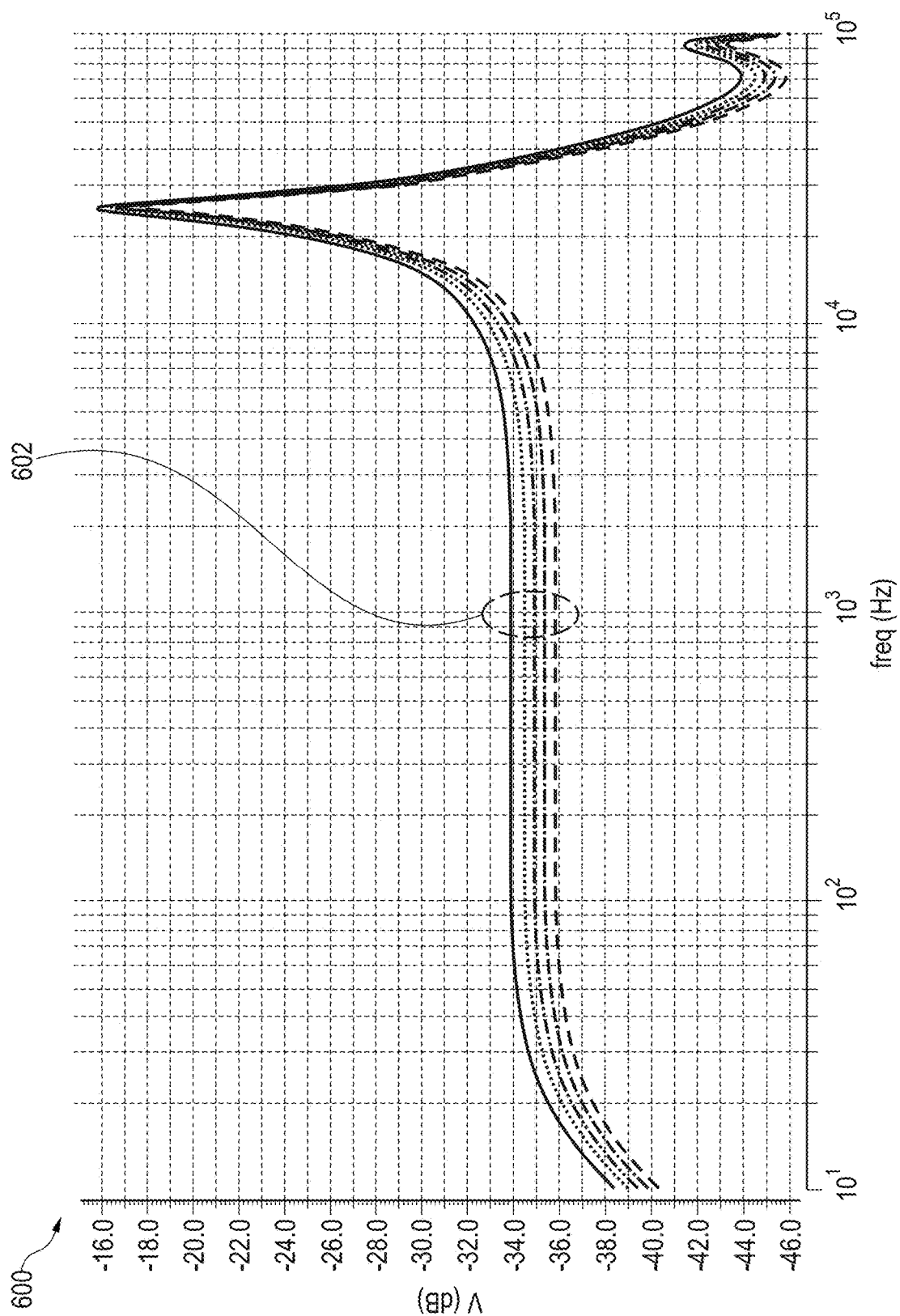
FIG. 6 is a graph of a gain adjustment sweep for the MEMS microphone of FIG. 5.

FIG. 6 is a graph 600 of an example gain adjustment (sensitivity) sweep 602 for the MEMS microphone 500 of FIG. 5. Sensitivity sweep 602 comprises a plurality of voltage gain (in dB) versus frequency (in Hz) traces for various capacitor ratios. For example, at a frequency of 1 kHz, sensitivity sweep 602 is adjusted between about −36 dB and about −34 dB. Similar sensitivity adjustments can be made throughout the audio frequency band.

MEMS microphone embodiments comprising an ultrasonic signal filter effective at the MEMS ASIC interface are described in further detail with respect to FIG. 7A, FIG. 7B, FIG. 7C, FIG. 9, FIG. 11, FIG. 13, and FIG. 15. Corresponding sensitivity graphs are shown in FIG. 8, FIG. 10, FIG. 12, and FIG. 14.

Figure 7A:
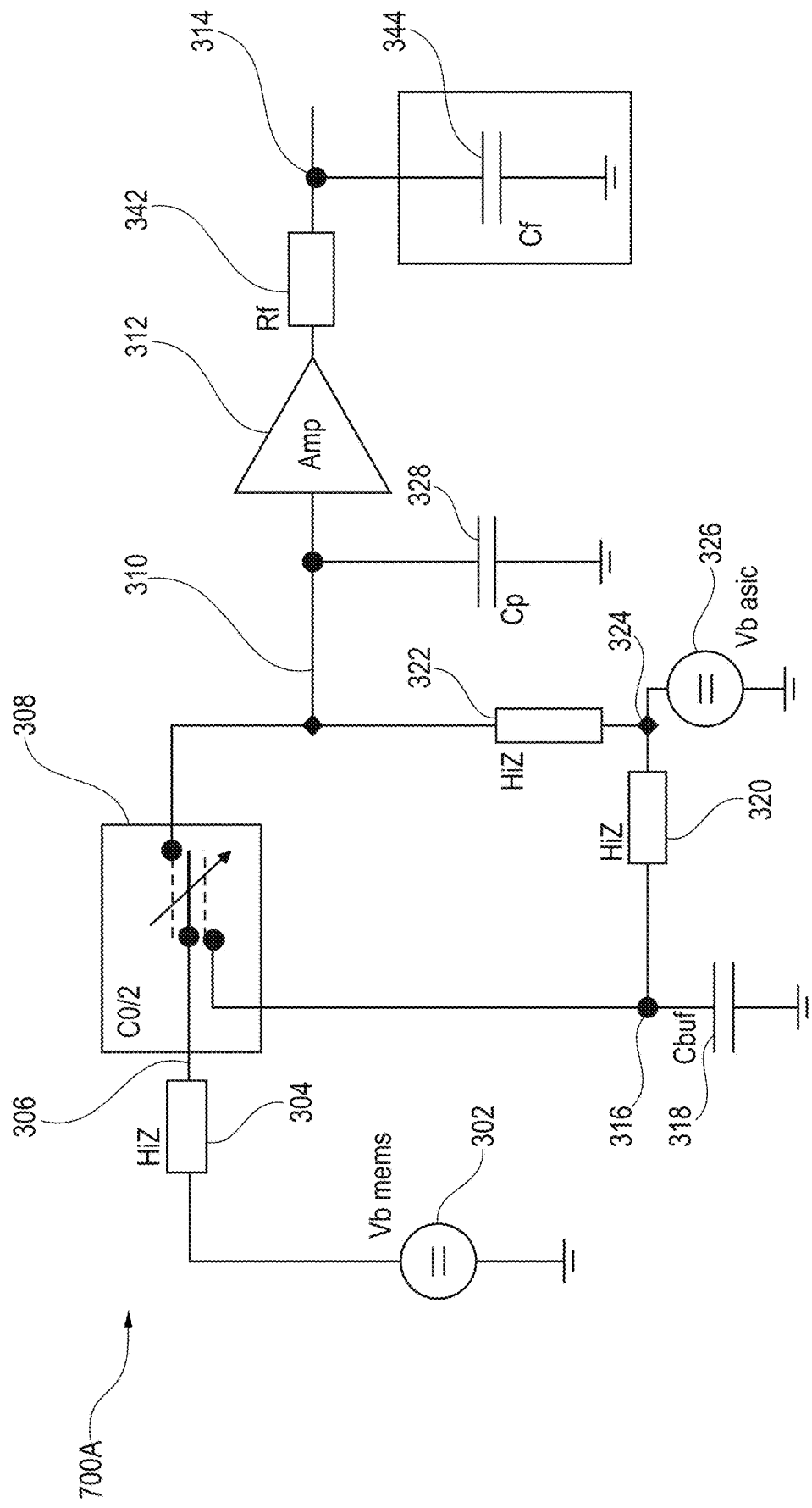
FIGS. 7A, 7B, and 7C are schematic diagrams of a DBP MEMS microphone further comprising a low pass filter at the amplifier output, according to an embodiment.

FIG. 7A is a schematic diagram of a DBP MEMS microphone 700A further comprising a low pass filter at the amplifier output, according to an embodiment. MEMS microphone 700A comprises all of the components in the same configuration as are shown in MEMS microphone 300 in FIG. 3, but further includes an ultrasonic (US) low pass filter that is described in further detail below.

US peaking is reduced by the addition of an analog low pass filter at the output of the unity gain buffer amplifier 312, as depicted in FIG. 7A. The low pass filter comprises resistor 342 (Rf) and capacitor 344 (Cf), wherein the output of the low pass filter is coupled to output node 314. Capacitor 324 is coupled between output node 314 and ground. The values of resistor 342 and capacitor 344 are selected to have a cut-off frequency fc in the frequency range of 7 kHz to 12 kHz, achieving a good compromise of filtering ultrasonic signals and not reducing sensitivity in the audio band. In order not to degrade the noise performance of MEMS microphone 700A, the value of resistor 342 is selected to be relatively low (typically below 10 k Ohm in embodiments). Consequently, the value of capacitor 344 is selected to be relatively high (typically several nF in embodiments) and is, for cost and size reasons, typically implemented outside of the ASIC as a discrete component. The packaging of MEMS device 308, the ASIC including the majority of the MEMS microphone 700A components, and the low pass filter including resistor 342 and capacitor 344 are discussed in further detail below, particularly with respect to FIG. 17.

Figure 7B:
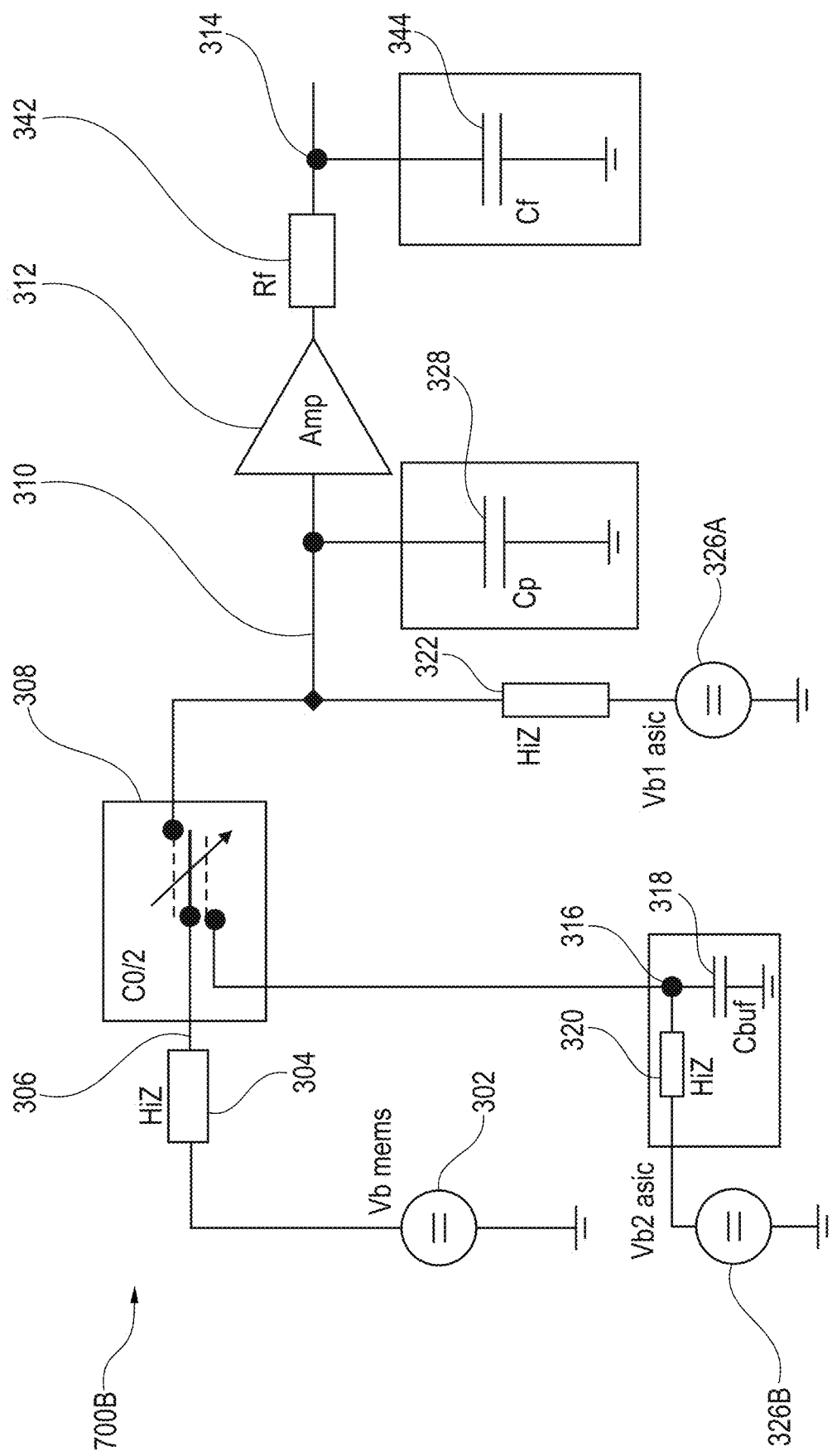

FIG. 7B is a schematic diagram of a DBP MEMS microphone 700B including all of the components in the same general configuration as are shown in MEMS microphone 700A shown in FIG. 7A, but further includes two different biasing voltage sources 326A (Vb1asic) and 326B (Vb2asic) that can be applied for optimized MEMS biasing and amplifier DC input biasing. In FIG. 7B, the second resistor device 322 is coupled between biasing voltage source 326A and node 310, and the third resistor device 320 is coupled between biasing voltage source 326B and node 316.

Figure 7C:
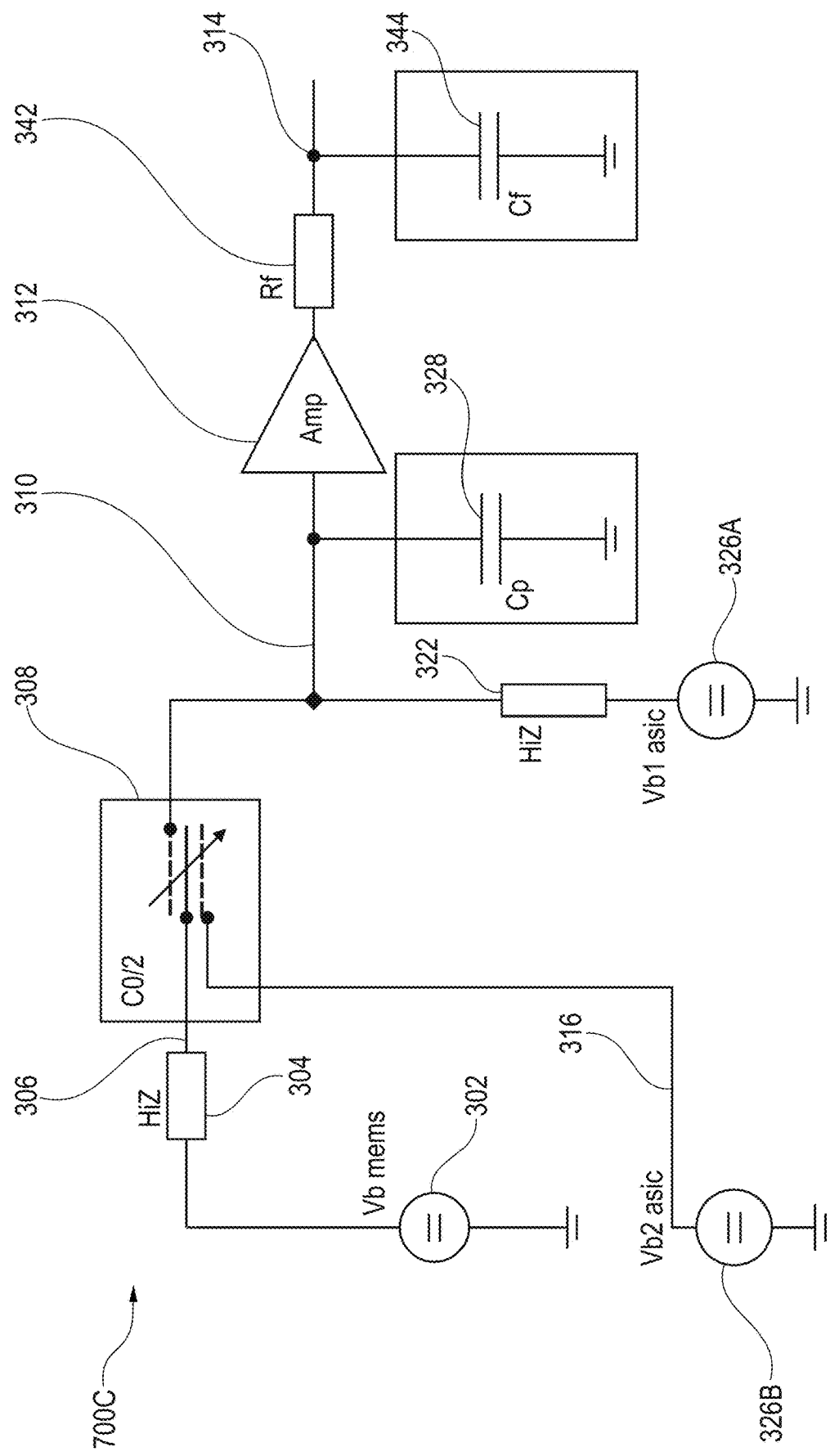

FIG. 7C is a schematic diagram of a DBP MEMS microphone 700C further including all of the components in the same general configuration as are shown in MEMS microphone 700B shown in FIG. 7B, except that the third resistor device 320 and first capacitor 318 are removed. The second backplate of MEMS device 308 and biasing voltage source 326B are both directly coupled to node 316.

Figure 8:
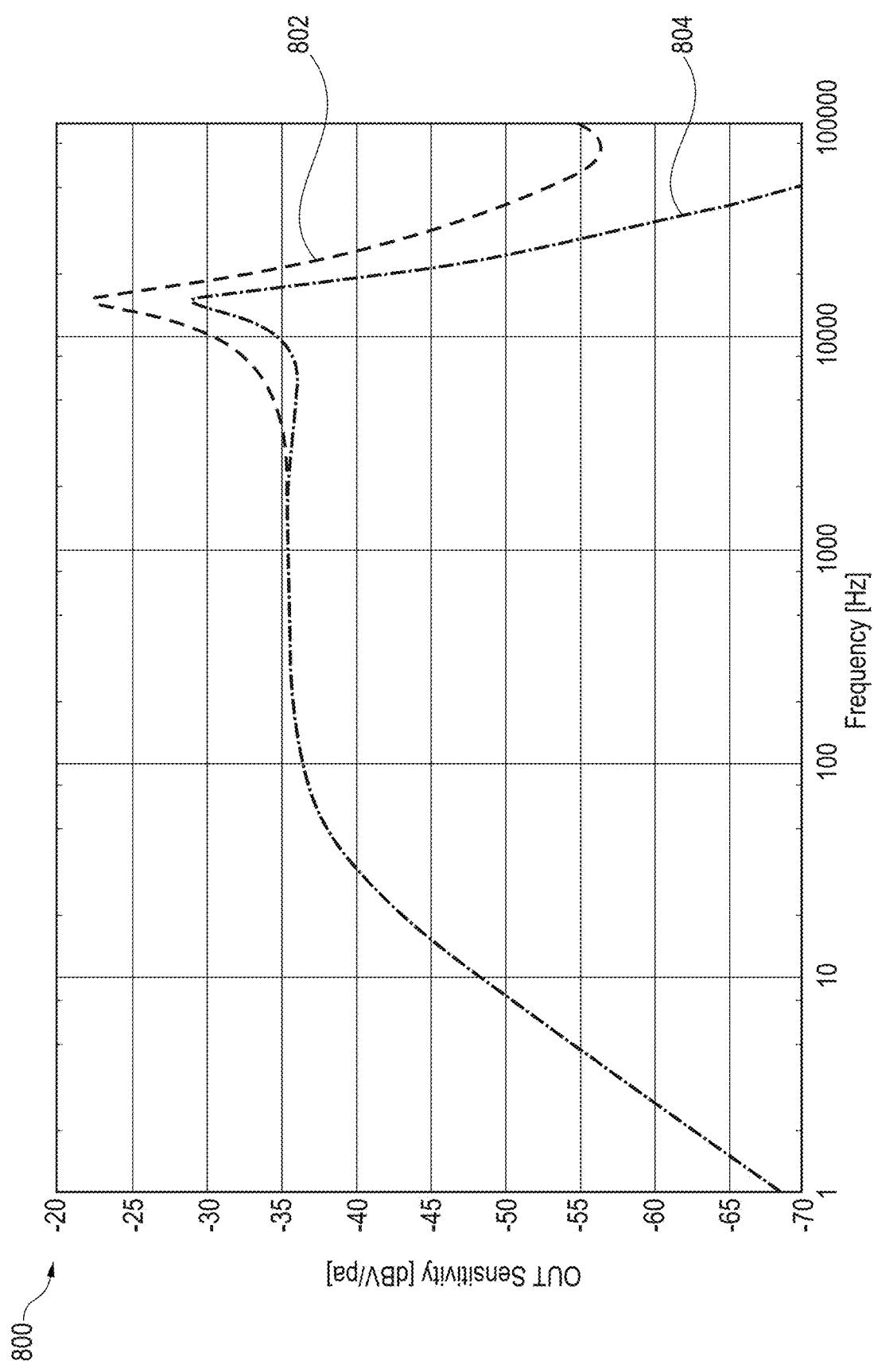
FIG. 8 is a graph of the unfiltered sensitivity and filtered sensitivity of the MEMS microphone of FIG. 7A.

FIG. 8 is a graph 800 of the unfiltered sensitivity and filtered sensitivity of the MEMS microphone 700A of FIG. 7A. FIG. 8 shows the frequency response of the sensitivity of MEMS microphone 700A before (output of unity gain buffer amplifier 312) and after (output node 314) of the low pass filter including resistor 342 and capacitor 344. In the example of FIG. 8, the resonance is designed to be inside the audio band, which does not boost the US signals. FIG. 8 thus compares the unfiltered MEMS microphone sensitivity 802 and the filtered MEMS microphone sensitivity 804. For example, the unfiltered US peak above 10 KHz is at about −22 dB, whereas the filtered US peak above 10 KHz is at about −29 dB.

The sensitivity of MEMS microphone 700A is thus strongly reduced at frequencies above 10 kHz. MEMS microphone 700A provides an output signal at output node 314 for further signal processing, for example in a codec or an ADC. However, MEMS microphone does not reduce ultrasonic signal levels at the MEMS ASIC interface (for example at node 310 in an embodiment), causing artefacts in unity gain buffer amplifier 312—especially when the supply voltage is low, e.g. 0.9V in a hearing aid application.

Addressing the above artefact issue using a passive low-pass filter interposed between MEMS 308 and the ASIC at node 310 cannot be realized with an RC filter without degrading noise and SNR performance substantially, since MEMS 308 is a high impedance capacitive signal source. Other types of filters that could address the above artefact issue would require high value inductors that are difficult to fabricate on an integrated circuit.

According to embodiments, filtering ultrasonic signals at the MEMS ASIC interface as opposed to filtering ultrasonic signals after the MEMS ASIC interface is implemented to further reduce audible artefacts described above. The ultrasonic functionality can be implemented by means of a positive feedback circuit topology. In the positive feedback circuit topology, typically the unity gain buffer amplifier 312 output signal is fed back to a MEMS device 308 biasing node, resulting in an increase of sensitivity over a wide frequency range. The positive feedback circuit topology is shown and described below with respect to FIG. 9 and FIG. 10.

Figure 9:
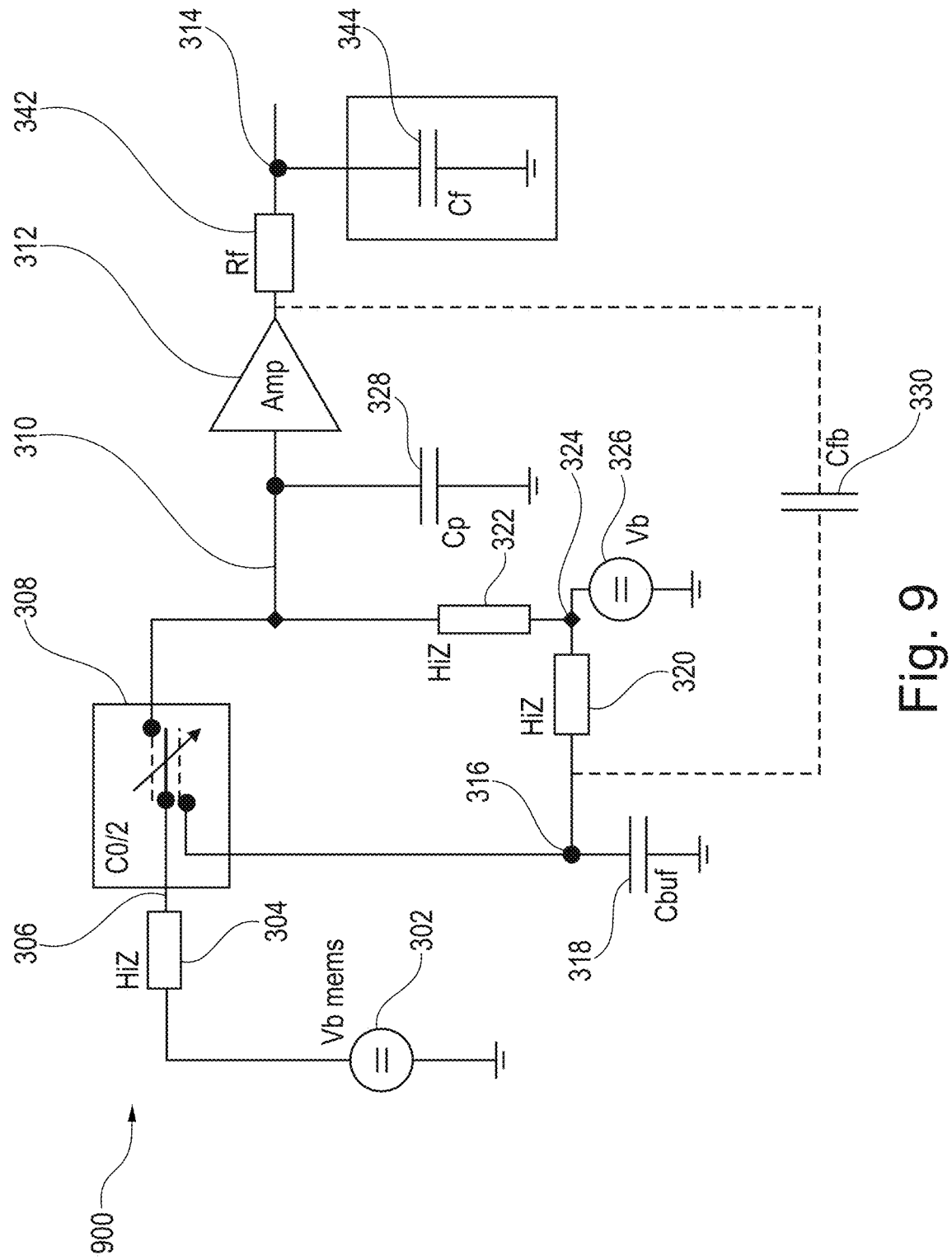
FIG. 9 is a schematic diagram of the MEMS microphone of FIG. 7A further comprising a positive feedback path, according to an embodiment.

FIG. 9 is a schematic diagram a MEMS microphone 900 of the MEMS microphone 700A of FIG. 7A further comprising a positive feedback path, according to an embodiment. All of the components and circuit topology of MEMS microphone 900 are the same as in MEMS microphone 700A, except for the positive feedback path. The positive feedback path comprises the second capacitor 330 (Cfb) coupled between the output of unity gain buffer amplifier 312 and node 316.

Figure 10:
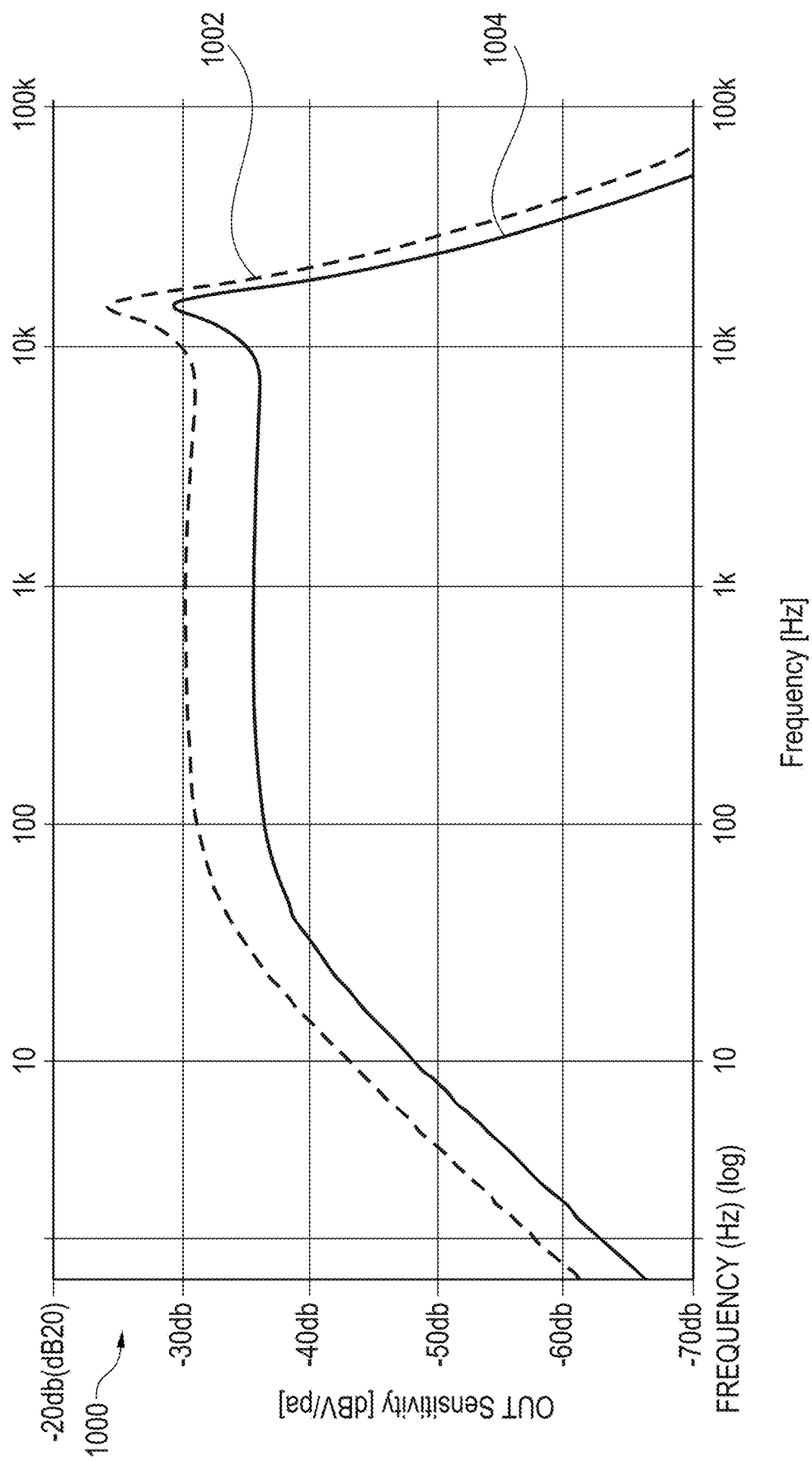
FIG. 10 is a graph of the sensitivity of the MEMS microphone of FIG. 9 with the feedback path and without the feedback path.

FIG. 10 is a graph 1000 of the sensitivity of the MEMS microphone of FIG. 9 with the feedback path and without the feedback path. Sensitivity 1004 without the positive feedback path is compared to sensitivity 1002 with the positive feedback path. Note that the gain is boosted at all frequencies by about 5 dB in the example of FIG. 10. For example, at a frequency of one kHz, the MEMS microphone gain without the positive feedback path is about −35 dB, whereas the MEMS microphone gain with the positive feedback is about −30 dB.

Figure 11:
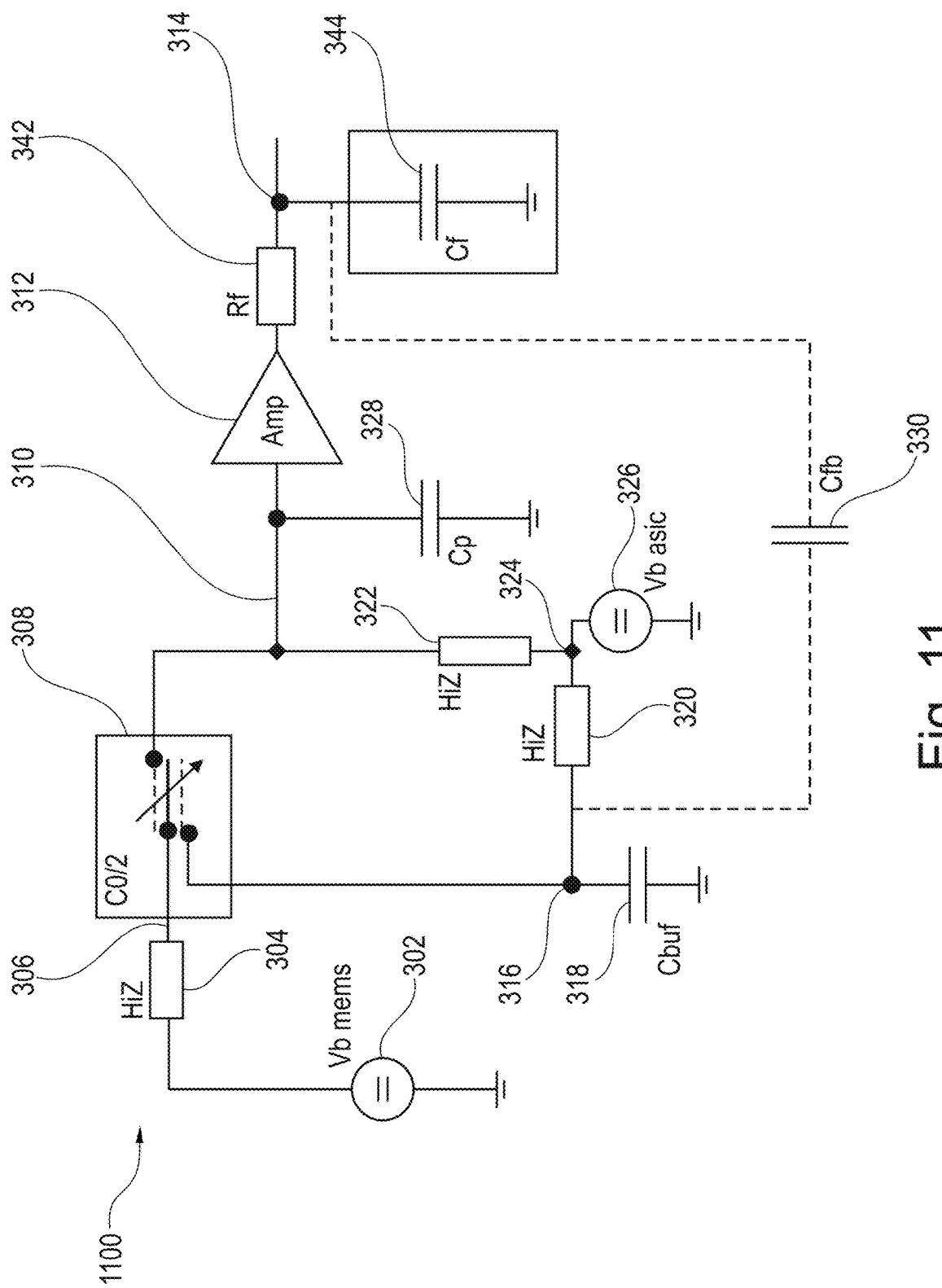
FIG. 11 is a schematic diagram of the MEMS microphone of FIG. 7A further comprising a positive feedback path, according to another embodiment.
Figure 12:
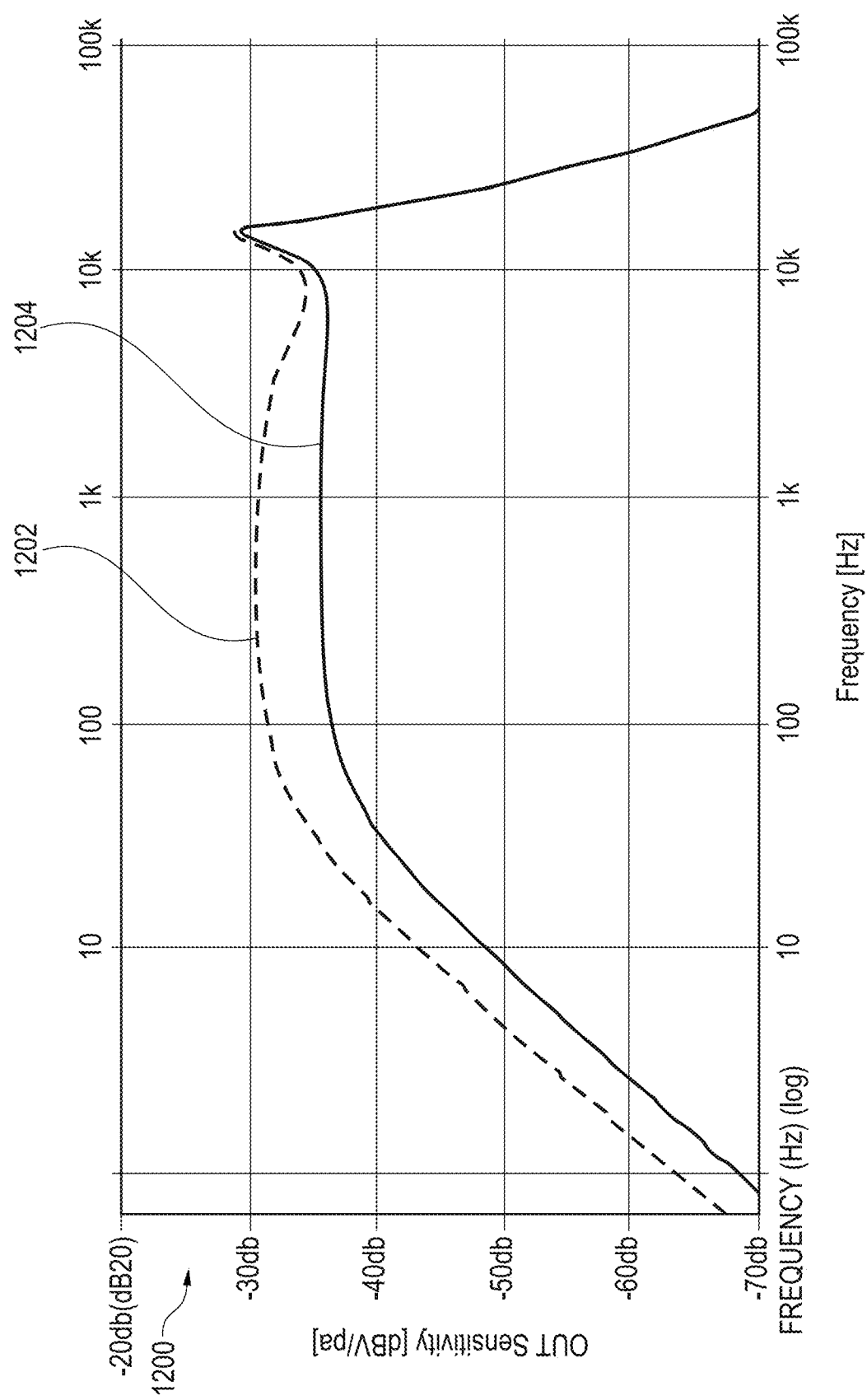
FIG. 12 is a graph of the sensitivity of the MEMS microphone of FIG. 11 with the feedback path and without the feedback path.

By using the low pass filtered signal (at output node 314) for the positive feedback to the MEMS backplate (as is shown in FIG. 11), only the signals at lower frequencies will be amplified (as is shown in FIG. 12). Signals with frequencies above the filter corner frequency fc will be unaltered.

FIG. 11 is a schematic diagram of MEMS microphone 1100, which is the MEMS microphone of FIG. 7A further comprising a positive feedback path, according to another embodiment. While the second feedback path includes the same second capacitor 330 as is shown in MEMS microphone 900 of FIG. 9, it is now coupled between output node 314 and node 316.

FIG. 12 is a graph 1200 of the sensitivity of the MEMS microphone 1100 of FIG. 11 with the feedback path and without the feedback path, wherein sensitivity 1204 without the feedback capacitor is compared with sensitivity 1202 with the feedback path. For example, the gain in the audio band is about 5 dB, wherein at the ultrasonic peak above 10 kHz, the gain is not boosted.

Figure 13:
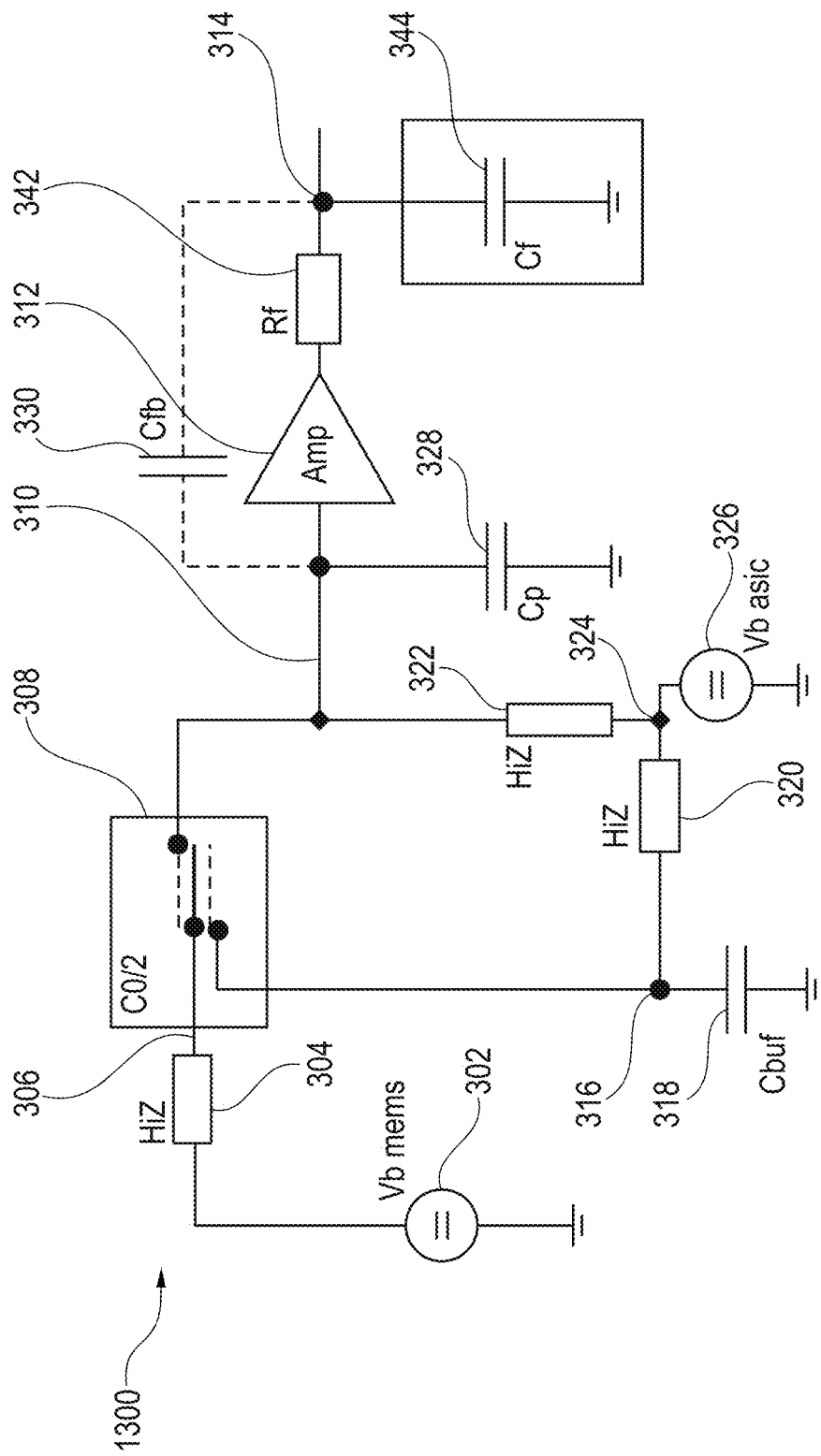
FIG. 13 is a schematic diagram of the MEMS microphone of FIG. 7A further comprising a positive feedback path, according to another embodiment.

FIG. 13 is a schematic diagram of an example of the filtered feedback to the top backplate (node 310) of MEMS device 308. MEMS microphone 1300 include all of the components of MEMS microphone 700A of FIG. 7A but comprising a positive feedback path, according to another embodiment. Specifically, the positive feedback path is provided by second capacitor 330 (Cfb) coupled between output node 314 and node 310.

By using a feedback capacitor between the output of the low pass filter including resistor 342 and capacitor 344 and the MEMS ASIC interface (at node 310 for example) frequencies below the corner frequency fc are unaltered as the feedback signal is the same at the MEMS ASIC interface (since unity gain buffer amplifier 312 is a unity gain amplifier, and the low pass has no effect at the frequencies below the corner frequency). However, for frequencies above the corner frequency fc, a capacitive voltage divider between the second capacitor 330 (Cfb) and the capacitor of MEMS device 308 is created that attenuates the electrical signal at the MEMS ASIC IN interface at node 310.

Figure 14:
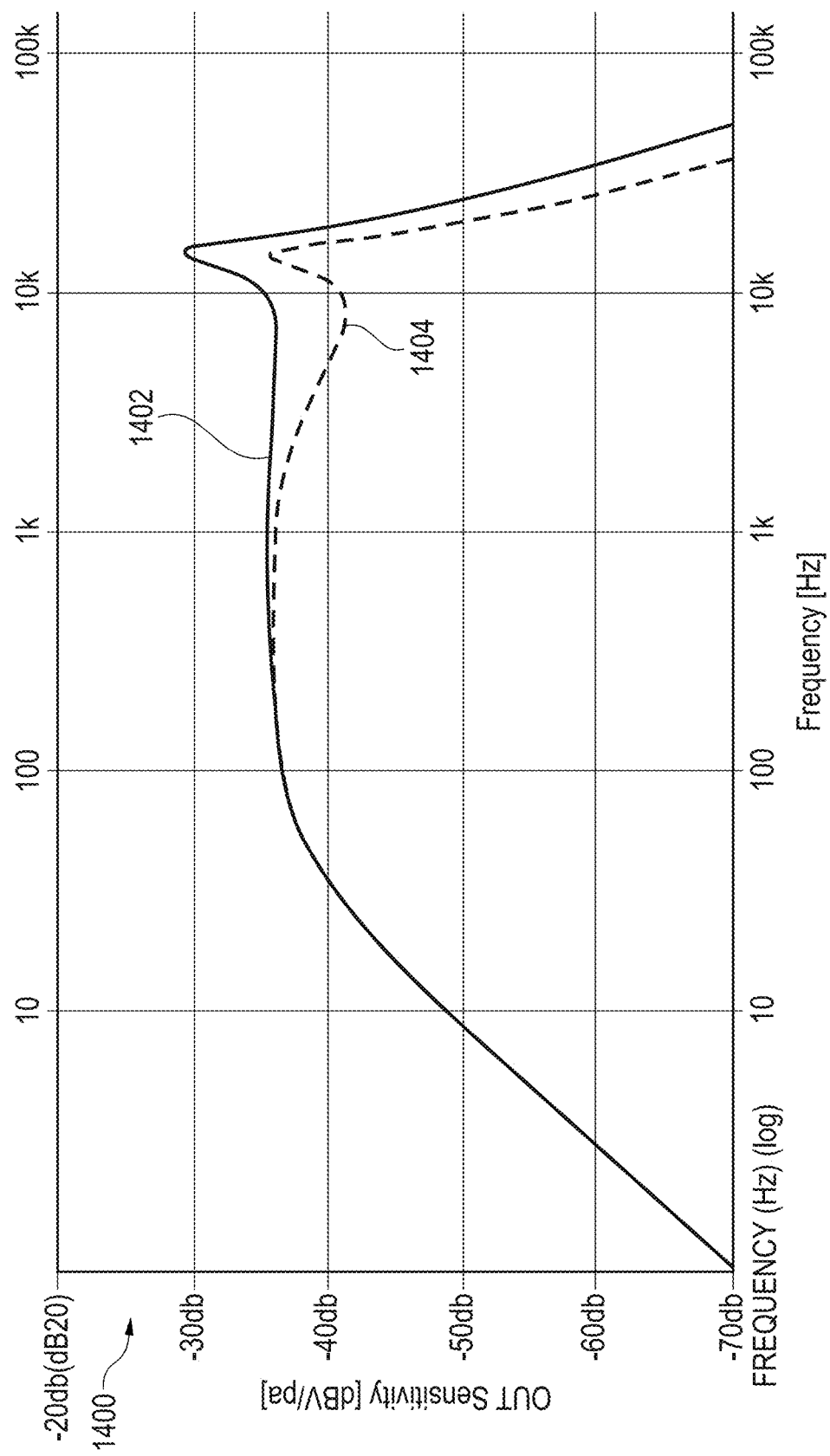
FIG. 14 is a graph of the sensitivity of the MEMS microphone of FIG. 13 with the feedback path and without the feedback path.

FIG. 14 is a graph 1400 of the sensitivity of the MEMS microphone 1300 of FIG. 13 with the feedback path and without the feedback path, wherein sensitivity 1404 with the feedback capacitor is compared with sensitivity 1402 without the feedback path. For example, the gain in the audio band is not boosted, wherein at the ultrasonic peak above 10 kHz, the gain is attenuated by about 5 dB.

The US signal suppression arrangement of FIG. 13 can thus reduce the nonlinearity contribution of the ASIC by reducing its electrical signal level. Additionally, intermodulation products of the MEMS with frequencies above the corner frequency fc are attenuated even stronger than with the low pass filter including resistor 342 and capacitor 344 alone. However, intermodulation products of the MEMS with frequencies below the corner frequency fc are unaltered.

Figure 15:
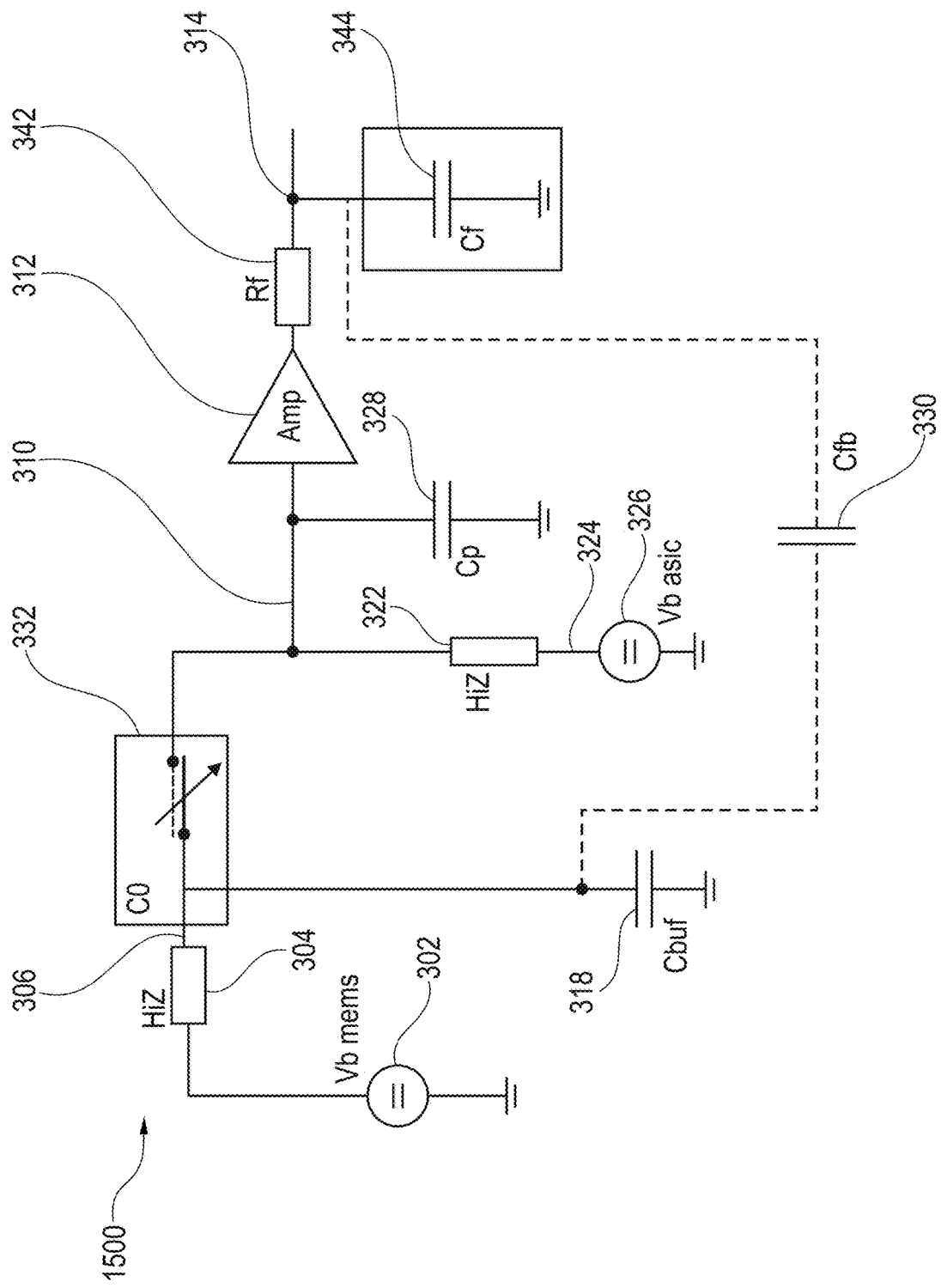
FIG. 15 is a schematic diagram of a single-backplate (SBP) MEMS microphone comprising a filtered feedback path.

The positive filtered feedback can be applied to a single backplate (SBP) MEMS device as well, as is depicted in the schematic diagram of a MEMS microphone 1500 shown in FIG. 15. MEMS microphone includes all of the components of MEMS microphone 1100 shown in FIG. 11, except for the MEMS device. Instead of a dual backplate (DBP) MEMS device, such as MEMS device 308, MEMS microphone 1500 comprises a single backplate (SBP) MEMS device 332. The membrane of MEMS device 332 is coupled to node 306 and the single backplate of MEMS device 332 is coupled to node 310. The input capacitance of MEMS device 332 is Co, compared to Co/2 for DBP MEMS device 308.

Figure 16:
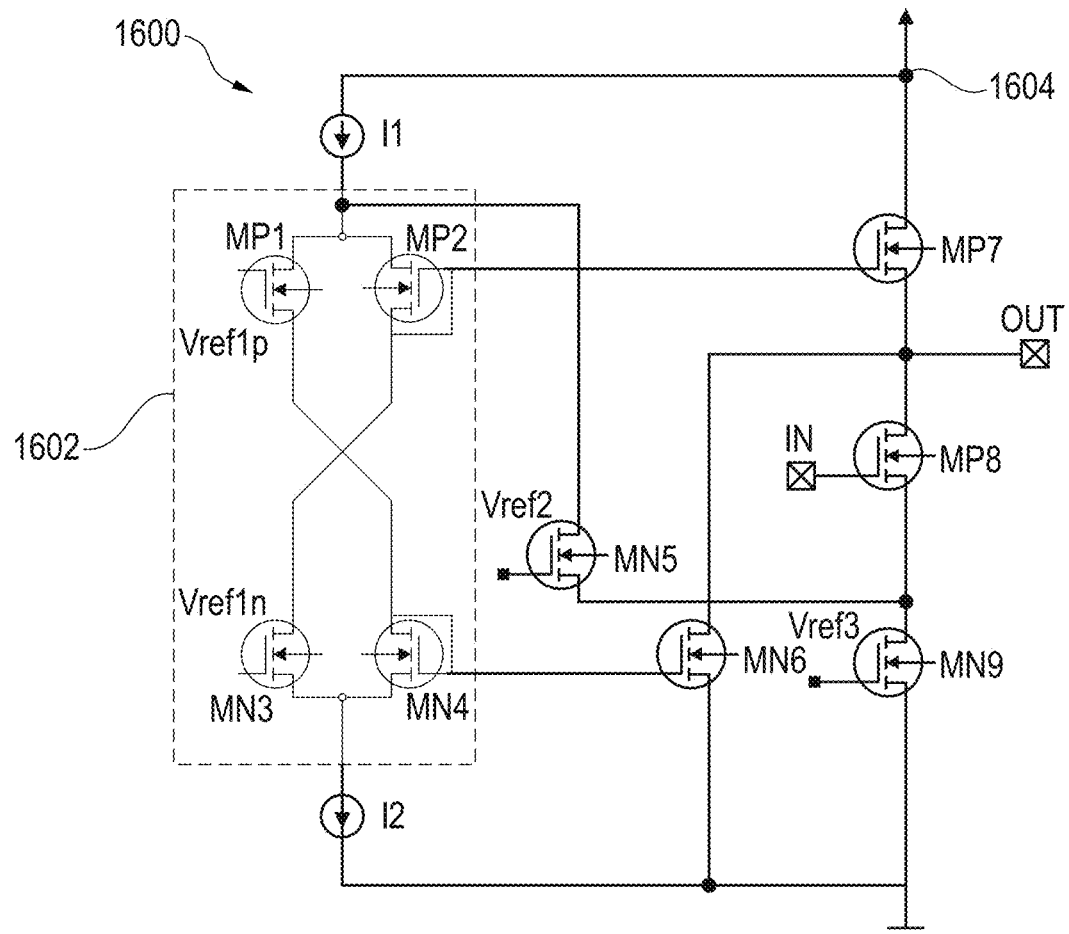
FIG. 16 is a schematic of a unity gain buffer amplifier suitable for use in the MEMS microphones shown in FIG. 3, FIG. 5, FIG. 7A, FIG. 7B, FIG. 7C, FIG. 9, FIG. 11, FIG. 13, and FIG. 15, according to an embodiment.

FIG. 16 is a schematic of a unity gain buffer amplifier 1600 suitable for use in the MEMS microphones shown in FIG. 3, FIG. 5, FIG. 7A, FIG. 7B, FIG. 7C, FIG. 9, FIG. 11, FIG. 13, and FIG. 15, according to an embodiment. In an embodiment, unity gain buffer amplifier 1600 comprises a class AB "super source follower" circuit including PMOS transistors MP1, MP2, MP7, and MP8; NMOS transistors MN3, MN4, MN5, MN6, and MN9; and current sources I1 and I2. Unity gain buffer amplifier 1600 is coupled between a power supply node 1604 and ground; and includes reference nodes Vref1p, Vref1n, Vref2, and Vref3 for receiving corresponding reference voltages. Transistors MP7, MP8, MN9, and MN5 provide the super source follower structure with a defined output quiescent current via reference voltage Vref3. Transistors MP1, MP2, MN3, and MN4 control the class AB biasing circuit 1602 for transistors MP7 and MN6 for a defined class AB quiescent current via voltage references Vref1p and Vref1n. The class AB biasing circuit 1602 is biased with biasing current sources I1 and I2. Feedback transistor MN5 in conjunction with reference voltage Vref2 provides push-pull functionality via transistors MP7 and MN6. Other suitable buffer amplifiers can be used in other embodiments.

Figure 17:
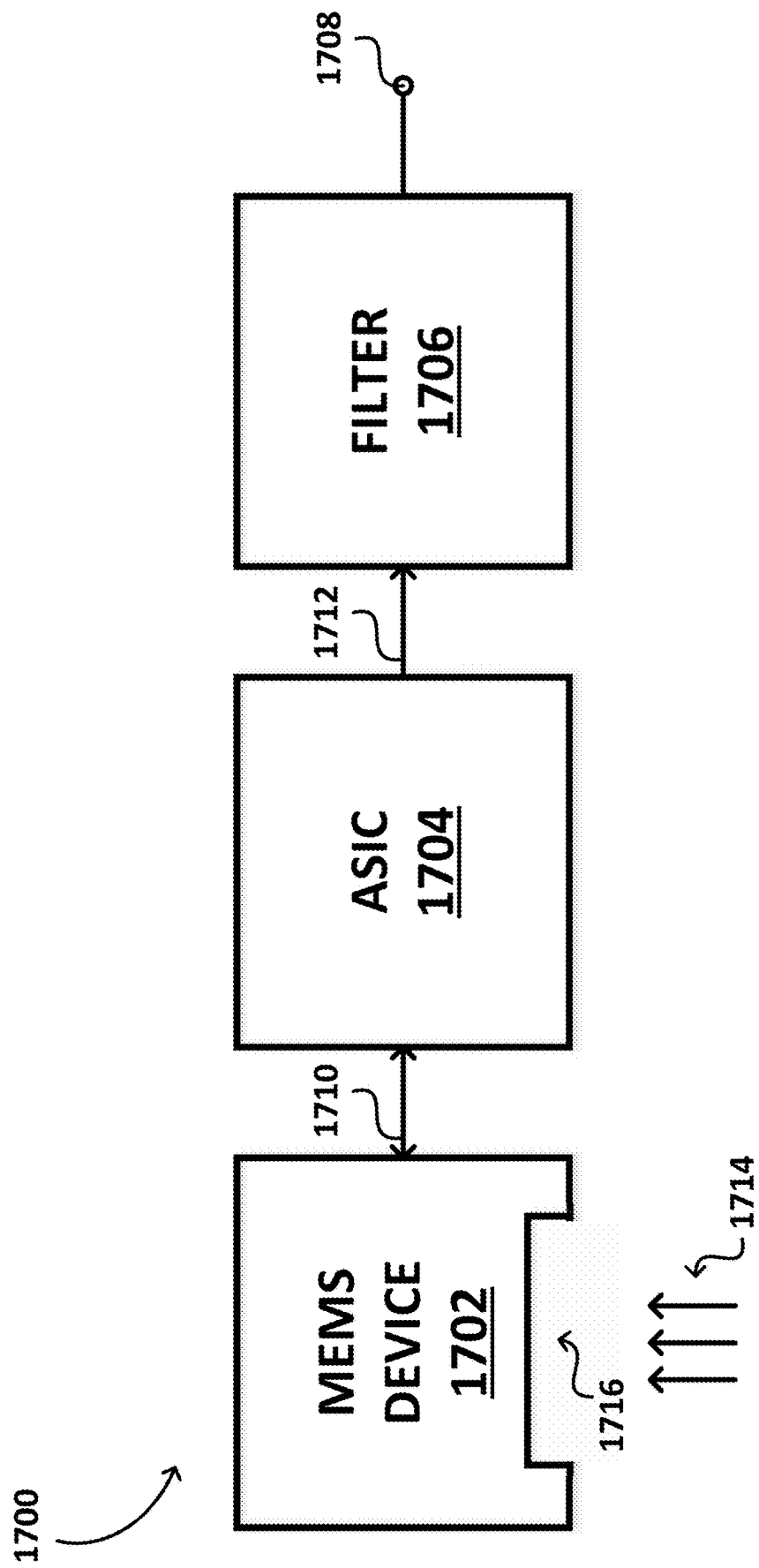
FIG. 17 is a block diagram of a packaging configuration for a MEMS device, an ASIC, and a filter, according to an embodiment.

FIG. 17 is a block diagram of a packaging configuration for a MEMS microphone 1700 including a MEMS device 1702, an ASIC 1704, and a filter 1706, according to an embodiment. MEMS device 1702 can comprise a single backplate MEMS device or a dual backplate MEMS device configured to receive environmental sound pressure 1714 through sound port 1716. Interface 1710 to ASIC 1704 can comprise two or three circuit nodes wherein DC biasing voltages are provided to the MEMS device 1702 from ASIC 1704, and analog signals are received by ASIC 1704 from MEMS device 1702. ASIC 1704 includes all of the resistor devices, capacitors, and the buffer amplifier previously described. ASIC 1704 also includes terminals for access to the external biasing voltages. The capacitors previously described are in the picofarad range and thus able to be fabricated on an integrated circuit. The resistor devices, described below with respect to FIG. 18, can comprise a plurality of serially-connected transistors, which can also be fabricated on an integrated circuit. The buffer amplifier can also be easily fabricated on the ASIC integrated circuit. Filter 1706 can include resistor 342 and capacitor 344, previously described, or just capacitor 344. Capacitor 344 is typically a high value capacitor having a capacitance above the picofarad range and is not easily fabricated on an integrated circuit. Filter 1706 provides the output of the MEMS microphone 1700 at terminal or node 1708 and is coupled to ASIC 1704 at interface 1712, which is a circuit node or package terminal of ASIC 1704.

Figure 18:
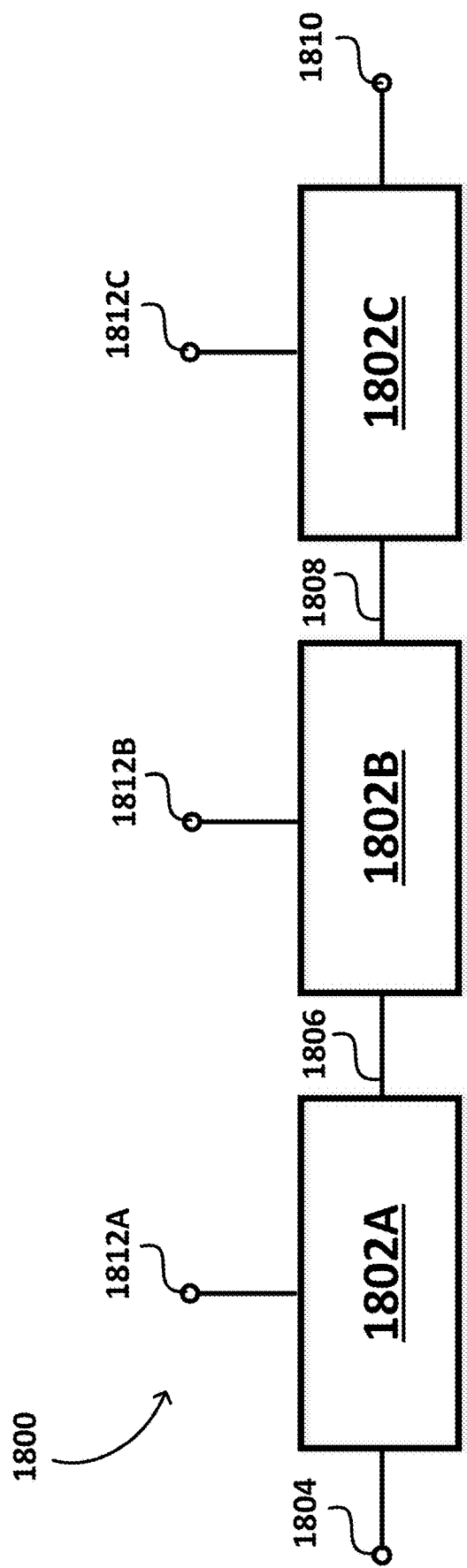
FIG. 18 is a schematic of a resistor device suitable for use in the MEMS microphones shown in FIG. 3, FIG. 5, FIG. 7A, FIG. 7B, FIG. 7C, FIG. 9, FIG. 11, FIG. 13, and FIG. 15, according to an embodiment.
Figure 19:
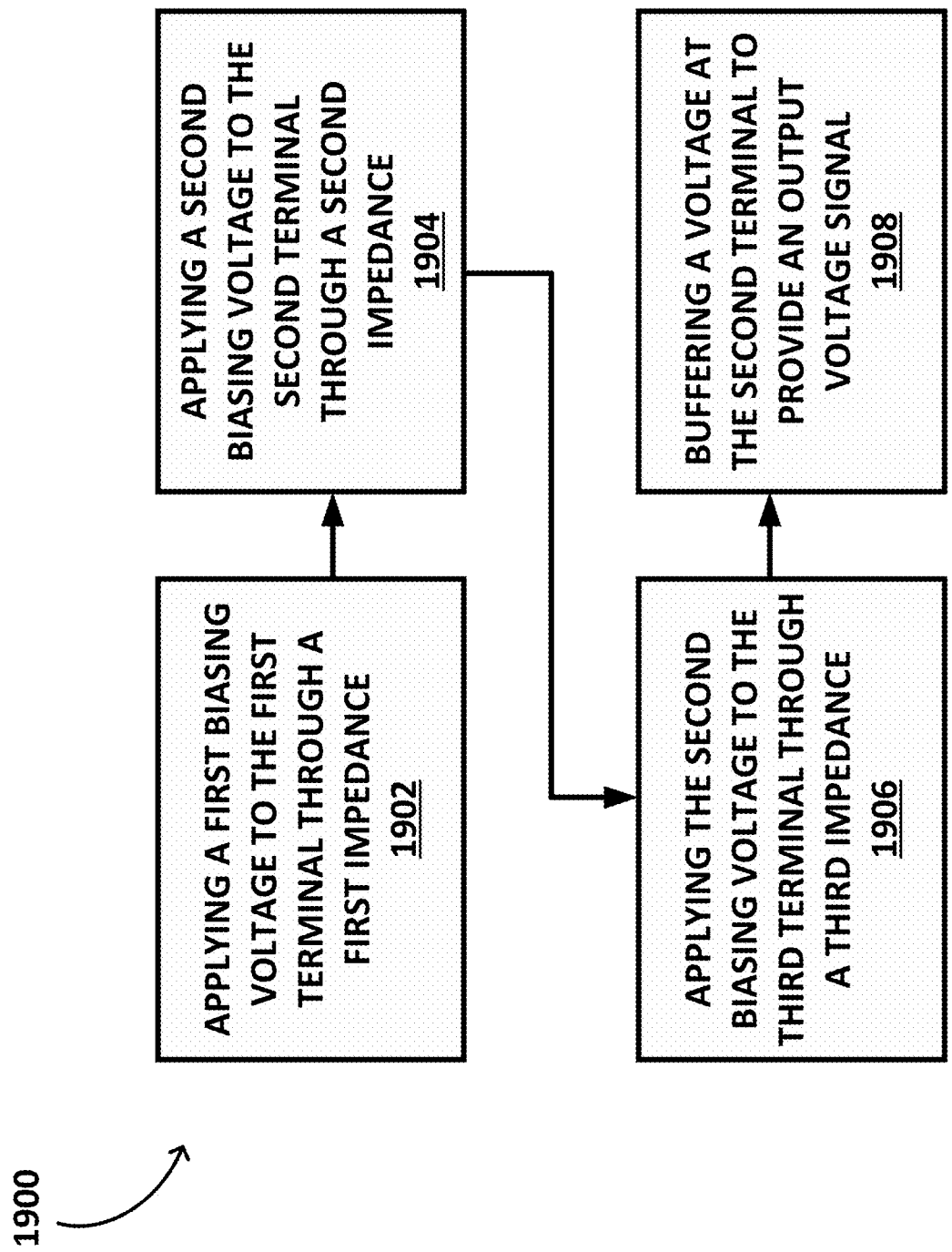
FIG. 19 is a block diagram of a method of biasing a MEMS device, according to an embodiment.

FIG. 18 is a schematic of a resistor device 1800 suitable for use in the MEMS microphones shown in FIG. 3, FIG. 5, FIG. 7A, FIG. 7B, FIG. 7C, FIG. 9, FIG. 11, FIG. 13, and FIG. 15, according to an embodiment. Resistor device 1800 provides a high resistance in the gigohm range between nodes 1804 and 1810, including transistor 1802A, transistor 1802B, and transistor 1802C in series connection. While only three transistors are shown in the example schematic of FIG. 18, any number of transistors can be used. The transistors can comprise either PMOS or NMOS transistors in embodiments. A current path of transistor 1802A is coupled between nodes 1804 and 1806, a current path of transistor 1802B is coupled between nodes 1806 and 1808, and a current path of transistor 1802C is coupled between nodes 1808 and 1810. A control node of transistor 1802A receives a bias voltage at node 1812A, a control node of transistor 1802B receives a bias voltage at node 1812B, and a control node of transistor 180C receives a bias voltage at node 1812C. The bias voltages can be the same bias voltage or different bias voltages in embodiments.

FIG. 1900 is a block diagram 1900 of a method of biasing a MEMS device having a first terminal, a second terminal, and a third terminal, the method comprising applying a first biasing voltage to the first terminal through a first impedance at step 1902; applying a second biasing voltage to the second terminal through a second impedance at step 1904; applying the second biasing voltage to the third terminal through a third impedance at step 1906; and buffering a voltage at the second terminal to provide an output voltage signal at step 1908. The values of the first impedance, the second impedance, and the third impedance are equal in an embodiment, but are unequal in other embodiments.

Example embodiments of the present invention are summarized here. Other embodiments can also be understood from the entirety of the specification and the claims filed herein.

Example 1. According to an embodiment, a circuit includes a first biasing voltage source; a second biasing voltage source; a first resistor device coupled between the first biasing voltage source and a first terminal of the circuit; a second resistor device coupled between the second biasing voltage source and a second terminal of the circuit; a third resistor device coupled between the second biasing voltage source and a third terminal; a first capacitor coupled between the third terminal and ground; and an amplifier having an input coupled to the second terminal, and an output coupled to a circuit output.

Example 2. The circuit of claim Example 1, further including a microelectromechanical (MEMS) device coupled to the first terminal, the second terminal, and the third terminal.

Example 3. The circuit of any of the above examples, further including a positive feedback path between the output of the amplifier and the second terminal, or between the output of the amplifier and the third terminal.

Example 4. The circuit of any of the above examples, wherein the MEMS device is packaged in a first package, and the first resistor device, the second resistor device, the third resistor device, the first capacitor, and the amplifier are packaged in a second package.

Example 5. The circuit of any of the above examples, further including a second capacitor coupled between the output of the amplifier and the third terminal.

Example 6. The circuit of any of the above examples, further including a filter resistor interposed between the output of the amplifier and the circuit output, and a filter capacitor coupled between the circuit output and ground.

Example 7. The circuit of any of the above examples, further including a second capacitor coupled between the output of the amplifier and the third terminal.

Example 8. The circuit of any of the above examples, further including a second capacitor coupled between the circuit output and the third terminal.

Example 9. The circuit of any of the above examples, further including a second capacitor coupled between the circuit output and the second terminal.

Example 10. According to an embodiment, a method of biasing a microelectromechanical (MEMS) device having a first terminal, a second terminal, and a third terminal includes applying a first biasing voltage to the first terminal through a first impedance; applying a second biasing voltage to the second terminal through a second impedance; applying the second biasing voltage to the third terminal through a third impedance; and buffering a voltage at the second terminal to provide an output voltage signal.

Example 11. The method of Example 10, further including packaging the MEMS device in a first package, and packaging the first impedance, the second impedance, and the third impedance in a second package.

Example 12. The method of any of the above examples, further including coupling a first capacitor to the third terminal.

Example 13. The method of any of the above examples, further including coupling a second capacitor between a source of the output voltage signal and the third terminal.

Example 14. The method of any of the above examples, further including filtering the output voltage signal to provide a filtered output voltage signal.

Example 15. The method of any of the above examples, further including coupling a second capacitor between a source of the output voltage signal and the third terminal.

Example 16. The method of any of the above examples, further including coupling a second capacitor between a source of the filtered output voltage signal and the third terminal.

Example 17. The method of any of the above examples, further including coupling a second capacitor between a source of the filtered output voltage signal and the second terminal.

Example 18. According to an embodiment, a circuit includes a microelectromechanical (MEMS) device having a first terminal and a second terminal; a first resistor device coupled between a first biasing voltage source and the first terminal; a second resistor device coupled between a second biasing voltage source and the second terminal; an amplifier having an amplifier input coupled to the second terminal, and an amplifier output; a filter having a filter input coupled to the amplifier output, and a filter output.

Example 19. The circuit of Example 18, further including a third resistor device coupled between the second biasing voltage source and a third terminal of the MEMS device.

Example 20. The circuit of any of the above examples, further including a third resistor device coupled between a third biasing voltage source and a third terminal of the MEMS device.

Example 21. The circuit of any of the above examples, wherein a third terminal of the MEMS device is directly coupled to a third biasing voltage source.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

As but one example, circuit features shown in the schematic diagrams such as a filter or feedback path can be used in various combinations in addition to those separately illustrated. It is therefore intended that the appended claims encompass any such modifications or embodiments.

What is claimed is:

1. A circuit comprising:
   a first biasing voltage source;
   a second biasing voltage source;
   a first resistor device coupled between the first biasing voltage source and a first terminal of the circuit;
   a second resistor device coupled between the second biasing voltage source and a second terminal of the circuit;
   a third resistor device coupled between the second biasing voltage source and a third terminal;
   a first capacitor coupled between the third terminal and ground;
   an amplifier having an input coupled to the second terminal, and an output coupled to a circuit output; and
   a microelectromechanical (MEMS) device coupled to the first terminal, the second terminal, and the third terminal.

2. The circuit of claim 1, further comprising a positive feedback path between the output of the amplifier and the second terminal, or between the output of the amplifier and the third terminal.

3. The circuit of claim 1, wherein the MEMS device is packaged in a first package, and the first resistor device, the second resistor device, the third resistor device, the first capacitor, and the amplifier are packaged in a second package.

4. The circuit of claim 1, further comprising a second capacitor coupled between the output of the amplifier and the third terminal.

5. The circuit of claim 1, further comprising a filter resistor interposed between the output of the amplifier and the circuit output, and a filter capacitor coupled between the circuit output and ground.

6. The circuit of claim 5, further comprising a second capacitor coupled between the output of the amplifier and the third terminal.

7. The circuit of claim 5, further comprising a second capacitor coupled between the circuit output and the third terminal.

8. The circuit of claim 5, further comprising a second capacitor coupled between the circuit output and the second terminal.

9. A method of biasing a microelectromechanical (MEMS) device having a first terminal, a second terminal, and a third terminal, the method comprising:
   applying a first biasing voltage to the first terminal through a first impedance;
   applying a second biasing voltage to the second terminal through a second impedance;
   applying the second biasing voltage to the third terminal through a third impedance; and
   buffering a voltage at the second terminal to provide an output voltage signal.

10. The method of claim 9, further comprising packaging the MEMS device in a first package, and packaging the first impedance, the second impedance, and the third impedance in a second package.

11. The method of claim 9, further comprising coupling a first capacitor to the third terminal.

12. The method of claim 9, further comprising coupling a second capacitor between a source of the output voltage signal and the third terminal.

13. The method of claim 9, further comprising filtering the output voltage signal to provide a filtered output voltage signal.

14. The method of claim 13, further comprising coupling a second capacitor between a source of the output voltage signal and the third terminal.

15. The method of claim 13, further comprising coupling a second capacitor between a source of the filtered output voltage signal and the third terminal.

16. The method of claim 13, further comprising coupling a second capacitor between a source of the filtered output voltage signal and the second terminal.

17. A circuit comprising:
   a microelectromechanical (MEMS) device having a first terminal and a second terminal;
   a first resistor device coupled between a first biasing voltage source and the first terminal;
   a second resistor device coupled between a second biasing voltage source and the second terminal;
   an amplifier having an amplifier input coupled to the second terminal, and an amplifier output;
   a filter having a filter input coupled to the amplifier output, and a filter output; and
   a third resistor device coupled between the second biasing voltage source and a third terminal of the MEMS device.

18. A circuit comprising:
   a microelectromechanical (MEMS) device having a first terminal and a second terminal;
   a first resistor device coupled between a first biasing voltage source and the first terminal;
   a second resistor device coupled between a second biasing voltage source and the second terminal;
   an amplifier having an amplifier input coupled to the second terminal, and an amplifier output;
   a filter having a filter input coupled to the amplifier output, and a filter output; and
   a third terminal of the MEMS device directly coupled to a third biasing voltage source.

* * * * *